United States Patent [19]

Suzuki

[11] Patent Number: 5,341,099
[45] Date of Patent: Aug. 23, 1994

[54] MAGNETIC RESONANCE IMAGING APPARATUS

[75] Inventor: Yoshinori Suzuki, Yokohama, Japan

[73] Assignee: Kabushiki Kaisha Toshiba, Kawasaki, Japan

[21] Appl. No.: 40,854

[22] Filed: Mar. 31, 1993

[30] Foreign Application Priority Data

Mar. 31, 1992 [JP] Japan .................. 4-105832
Mar. 25, 1993 [JP] Japan .................. 5-89508

[51] Int. Cl.$^5$ ........................... G01R 33/20
[52] U.S. Cl. ........................... 324/309; 324/307
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,780,675 | 10/1988 | DeMeester et al. | 324/312 |
| 4,833,407 | 5/1989 | Holland et al. | 324/309 |
| 4,851,779 | 7/1989 | DeMeester et al. | 324/312 |
| 4,912,412 | 3/1990 | Suzuki et al. | 324/312 |
| 4,912,413 | 3/1990 | DeMeester et al. | 324/312 |
| 4,993,075 | 2/1991 | Sekihara et al. | 324/309 |
| 5,025,216 | 6/1991 | Pauly et al. | |
| 5,151,656 | 9/1992 | Maier et al. | 324/309 |

FOREIGN PATENT DOCUMENTS

| | | |
|---|---|---|
| 0270320 | 8/1988 | European Pat. Off. |
| 0280310 | 8/1988 | European Pat. Off. |
| 0306135 | 3/1989 | European Pat. Off. |
| 0329299 | 8/1989 | European Pat. Off. |
| 0401429 | 12/1990 | European Pat. Off. |
| 1131649 | 5/1989 | Japan |
| 241138 | 2/1990 | Japan |

Primary Examiner—Michael J. Tokar
Attorney, Agent, or Firm—Oblon, Spivak, McClelland, Maier & Neustadt

[57] ABSTRACT

Data is produced from asymmetrical echo data, and an MR image is reconstructed from the data thus produced. Namely, inverse Fourier transformation is performed on center echo data, thereby producing phase data. The phase data is inverted in polarity, thereby producing polarity-inverted phase data. Fourier transformation is performed on the polarity-inverted phase data in a readout direction, producing phase-correction data. Inverse Fourier transformation is performed on the asymmetrical echo data in an encode direction. The phase-correction data and the echo data are convoluted in the readout direction, thereby producing echo-data free of phase distortion. Unmeasured echo data is inferred from the convoluted data by utilizing complex conjugate property of the echo data. Inverse Fourier transformation is performed on the convoluted data and the inferred data in the readout direction, thereby producing an image free of phase distortion.

20 Claims, 15 Drawing Sheets

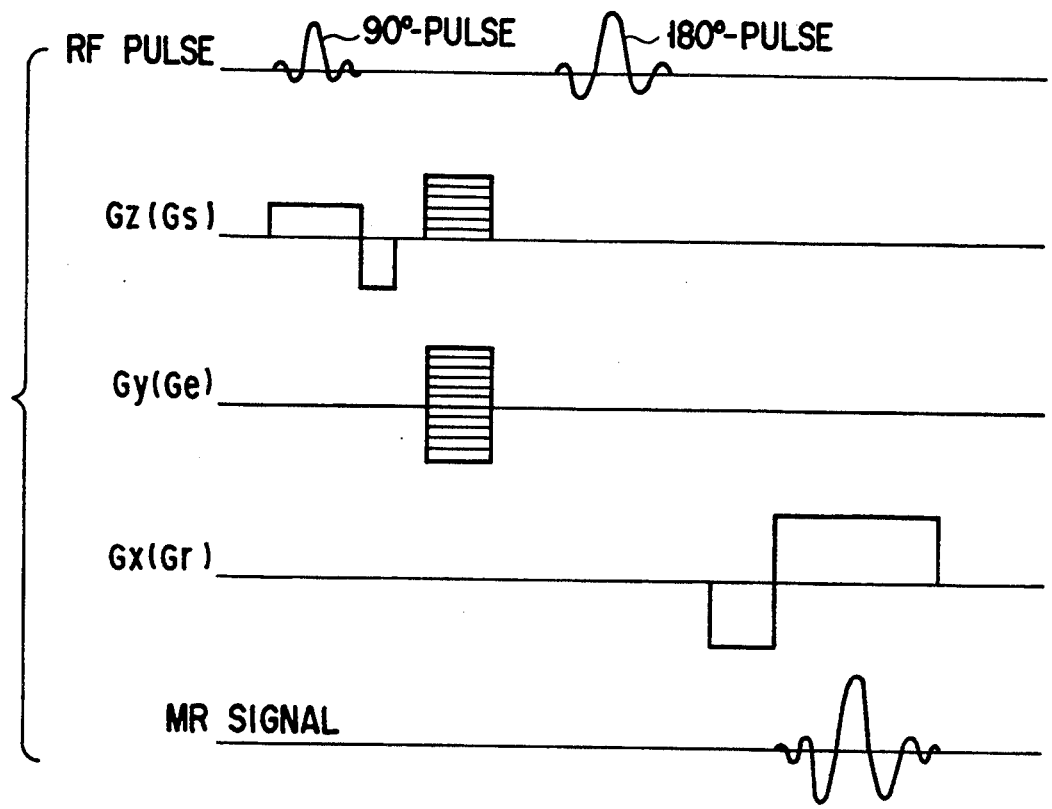
FIG. 7
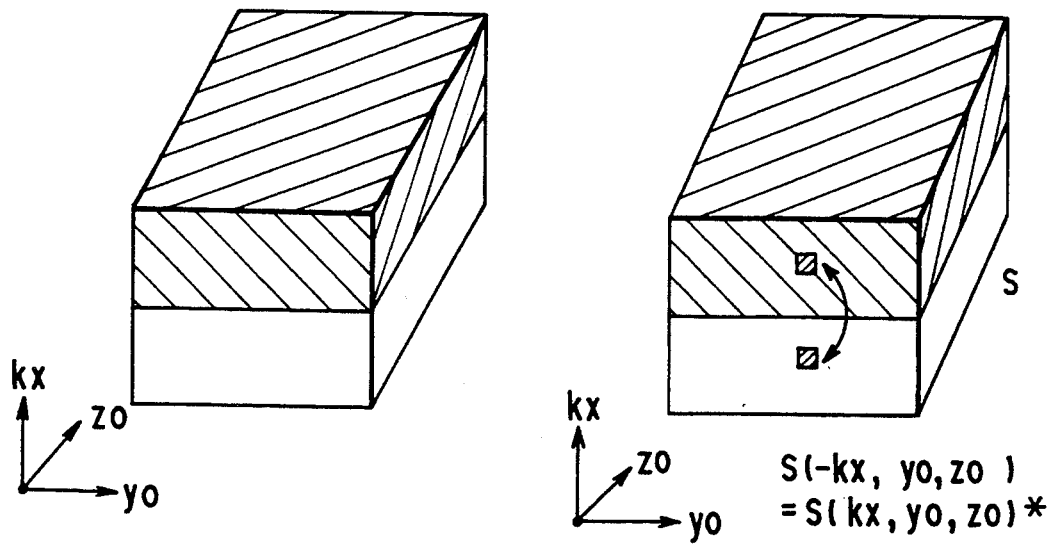
FIG. 8
FIG. 9

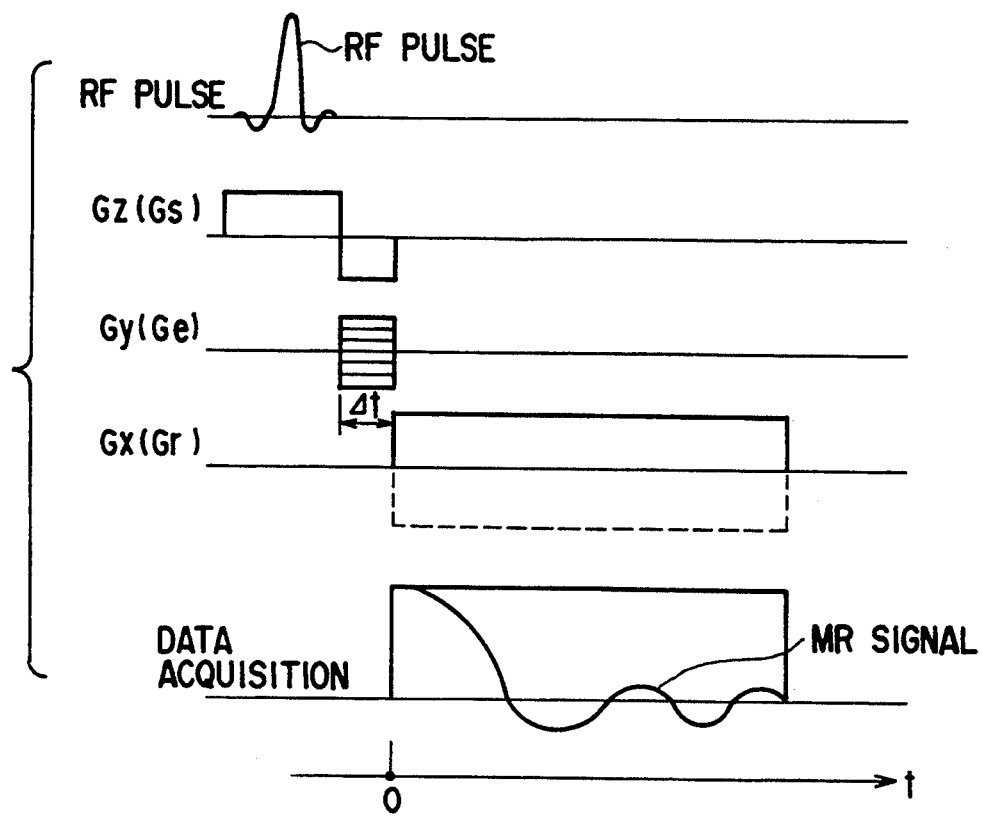
F I G. 11
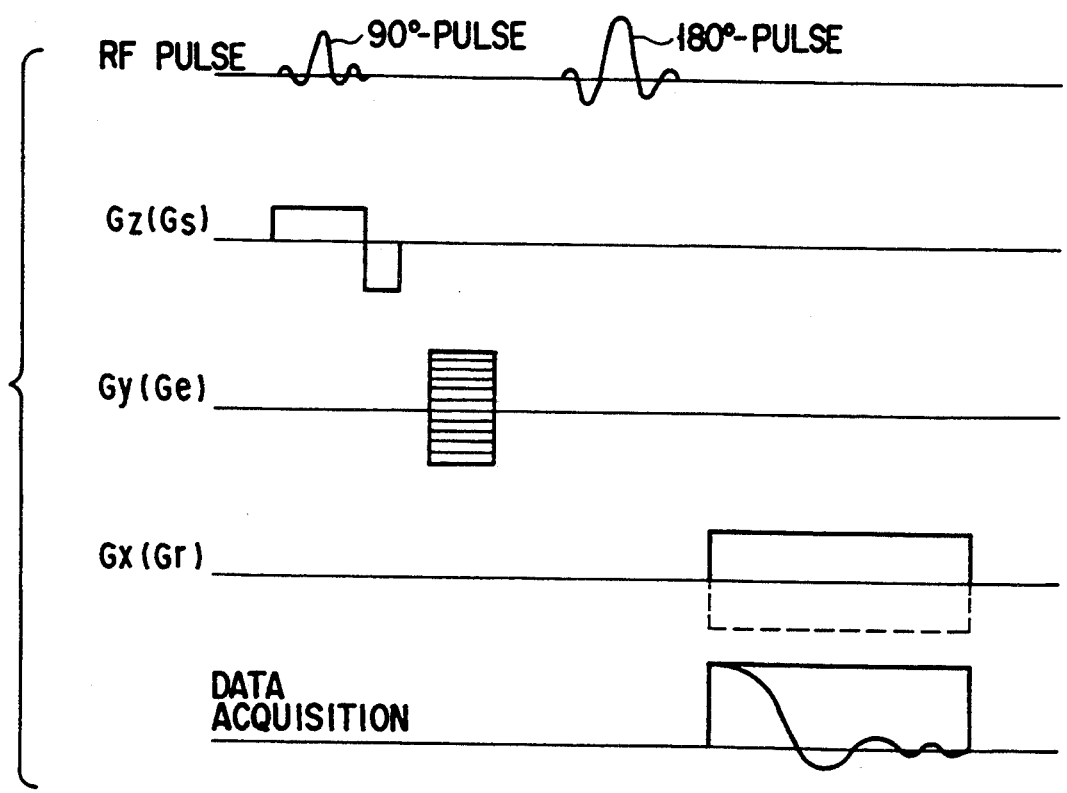
F I G. 12

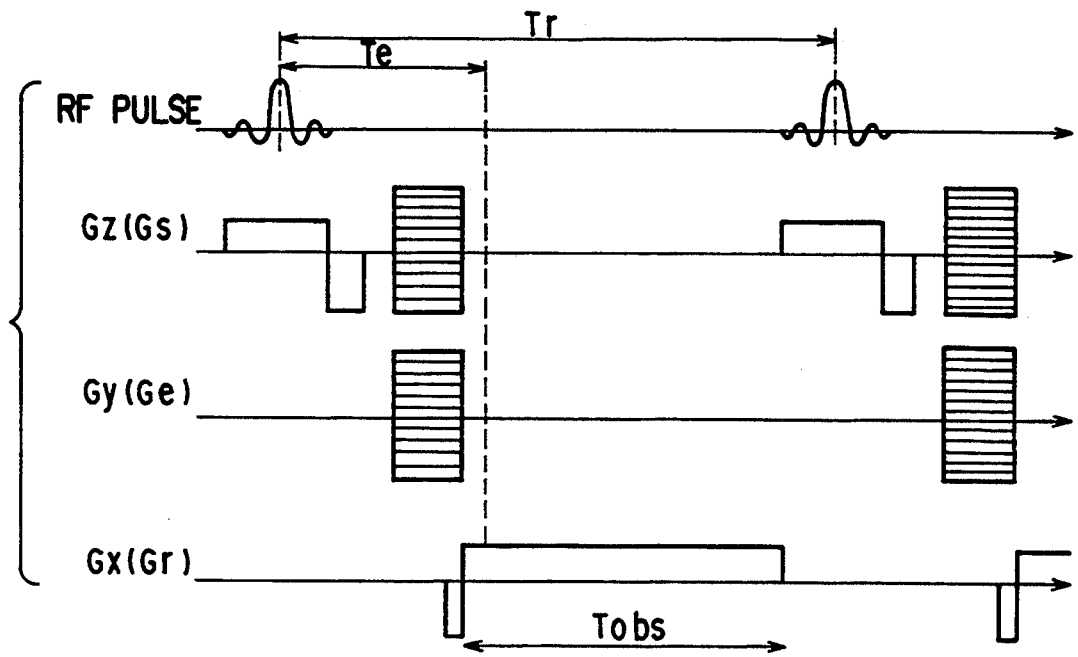
F I G. 20
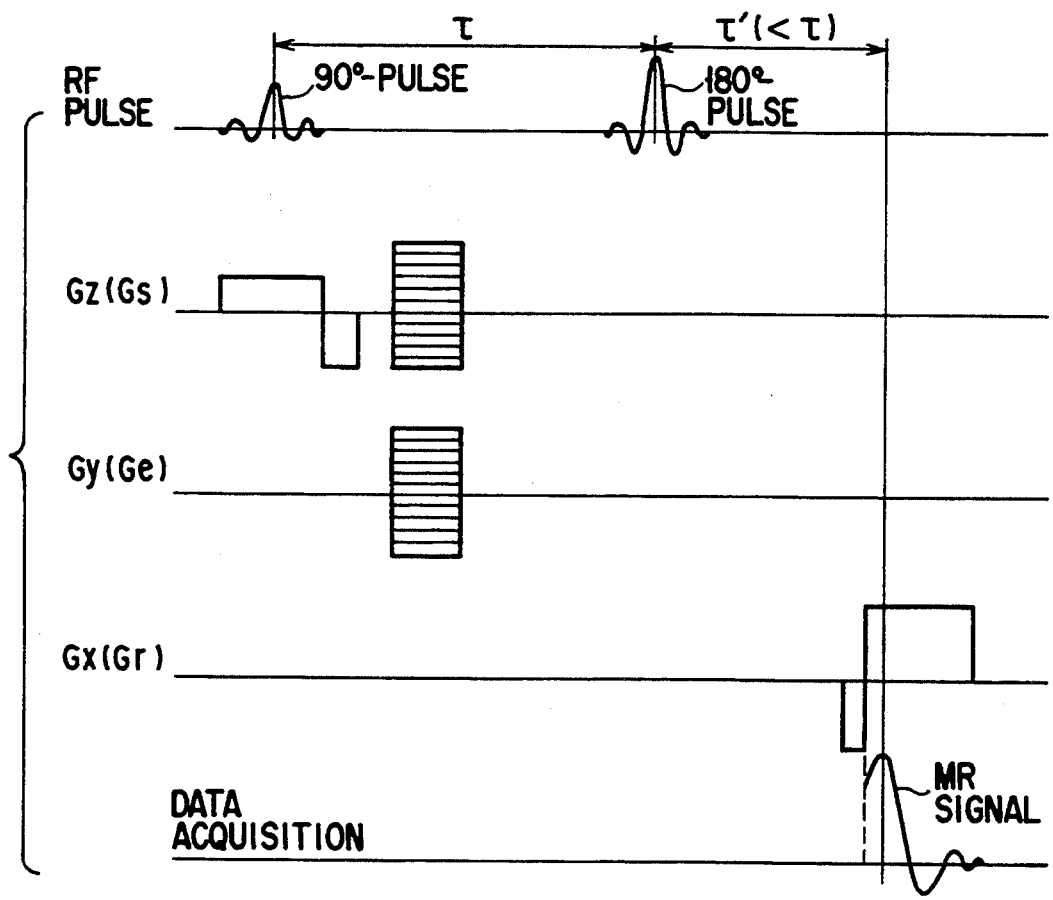
F I G. 21

MAGNETIC RESONANCE IMAGING APPARATUS

Background of the Invention

1. Field of the Invention

The present invention relates to a magnetic resonance imaging apparatus adapted to obtain a magnetic resonance (MR) image which is a reflection of at least one morphological information such as cross-sectional images of a subject under examination and functional information such as chemical shift images of the subject by utilizing magnetic resonance phenomena.

2. Description of the Related Art

The magnetic resonance imaging apparatus can obtain various cross-sectional MR images and chemical shift images of a subject under examination in a noninvasive manner. A magnetic resonance imaging apparatus, recently developed, can perform advanced imaging techniques such as high-resolution imaging, three-dimensional imaging, four-dimensional chemical shift imaging, and the like.

Three-dimensional imaging and high-resolution imaging are essential to angiography which visualizes blood vessels. To accomplish three-dimensional imaging and high-resolution imaging, a magnetic resonance imaging apparatus processes large amounts of data. For processing of handle large amounts of data, it is necessary not only to increase the time required for image reconstruction, but also to increase the time required for data acquisition and the amount of memory in a reconstruction unit.

Among the methods of solving problems encountered in handling large amounts of data is a method called "Half Fourier method." In this method, data in a particular axis for a specific polarity only is acquired, thereby reducing the data acquisition time to half.

The time elapsing from excitation of spins to acquisition of signals, i.e., the echo time, is the shortest. Therefore, this method is advantageous for performing the sensitivity of the signal deteston. This method is a optimum technique for obtaining high-resolution images.

Hereinafter, the principle of the Half Fourier method will be described using mathematical notations. Data, which is treated as discrete data in a magnetic resonance imaging apparatus, will be regarded here as continuous data for simplicity of description.

The following equation represents a magnetic resonance signal s obtained by four-dimensional chemical shift imaging technique.

$$s(kx,ky,kx,t) = \int\int\int\int \rho(x,y,z,\omega) \cdot \exp(-j(kx \cdot x + ky \cdot y + kz \cdot z + \omega \cdot t))dxdydzd\omega$$

By performing inverse Fourier transforming on the signal s(kx, ky, kz, t) with respect to kx, ky, kz and t, the density distribution (x, y, z, w) of a specific type of atomic nuclei, i.e., an MR cross-sectional image and a chemical shift image, can be obtained. It should be noted that a magnetic resonance signal s obtained by two- or three-dimensional chemical shift imaging technique can be represented by an equation which is substantially identical to the above equation relates to the four-dimensional chemical shift imaging.

In the Half Fourier method, the following equation is applied to obtain an MR image using half as much data as was needed hitherto:

$$s(kx,ky,kz,t)^* = \int\int\int\int \rho(x,y,\omega) \cdot \exp(kx \cdot x + ky \cdot y + kz \cdot z + \omega \cdot t))dxdydzd\omega = s(-kx,-ky,-kz,-t)$$

where * indicates complex conjugate.

This equation holds when (x, y, z, w) is a real number.

That is, to obtain a four-dimensional chemical shift image, it is basically required to acquire data of both polarities (positive and negative) for kx, ky, kz and t. Nonetheless, the above equation is used, creating the remaining half of data from the data of a specific polarity. The halves of data are processed, to obtain the density distribution of atomic nuclei of a specific type.

This will be described in detail, taking two-dimensional image data for example. Perfect data can be obtained in two steps. First, half of two-dimensional image data, shaded in FIG. 1, is acquired. Next, complex conjugate data is applied to locations which are symmetric with respect to the origin O. The perfect data, thus obtained, is subjected to two-dimensional inverse Fourier transformation, thereby acquiring data which represents a two-dimensional image. Since the two-dimensional image can be reconstructed from half the amount of data, the data acquisition time is reduced to half. A typical field-echo pulse sequence is illustrated in FIG. 2, and full echo data acquired by the field-echo technique is illustrated in FIG. 3.

The Half Fourier method is advantageous for the short data acquisition time which is only half the time needed in the conventional method. However, it is no more advantageous with regard to the amount of data to process to reconstruct an image. In the Half Fourier method, as well, the image-reconstructing time is long in proportion to the amount of data.

Three-dimensional imaging is essential to angiography for visualizing blood vessels. Therefore, a lone time is required to acquire data, and the signal-to-noise (S/N) ratio in images decreases with an increase of image resolution. Among the methods of reducing the data acquisition time is one known as "field-echo technique." This technique is to collect echo signals by inverting a readout gradient magnetic field. The use of FID signals helps reduce both the pulse repetition time and the data acquisition time. With this technique, however, the time elapsing from excitation of spins to acquisition of signals, i.e., the echo time, is about several milliseconds at the shortest. The echo time much increases to tens of milliseconds, particularly in a pulse sequence wherein the sampling interval is long, narrowing the signal bandwidth to improve the S/N ratio. The longer the echo time, MR signals are attenuated by the magnetic field inhomogeneity and the turbulent flow. Consequently, the image reconstructed will be dark. Regions around the bones or the blood vessels, where magnetic susceptibility changes rapidly, cannot have a sufficient magnetic field homogeneity. The signal attenuation for these regions is great, narrow blood vessels may not be visualized.

SUMMARY OF THE INVENTION

It is an object of the present invention to provide a magnetic resonance imaging apparatus which has a short image reconstruction time.

It is the other object of the present invention to provide a magnetic resonance imaging apparatus which can improve the S/N ratio, without darkening images of regions where magnetic field homogeneity is low.

These objects are attained by a magnetic resonance imaging apparatus which comprises:

data acquiring means for acquiring asymmetrical echo data consistent of half-echo data relating to a k space and center echo data relating to the center of the k space, from a subject to which a static magnetic field, gradient magnetic fields and radio-frequency electromagnetic waves have been applied; and data-producing and -reconstructing means for performing inverse Fourier transformation on the center echo data, thereby producing phase data, for inverting the phase data in polarity, thereby producing polarity-inverted phase data, for performing Fourier transformation on the polarity-inverted phase data in readout direction, thereby producing phase-correction data, for performing inverse Fourier transformation on the asymmetrical echo data in encode direction, thereby producing echo data, for convoluting the phase-corrector data and the echo data, in the readout direction, thereby producing convoluted data free of phase distortion, for inferring unmeasured echo data from the convoluted data by utilizing complex conjugate property of the echo data, for performing inverse Fourier transformation on the convoluted data and the inferred data in the readout direction, thereby producing an image free of phase distortion, and for reconstructing from the asymmetrical echo data an MR image of a specific region of the subject.

Also, the objects are achieved by a magnetic resonance imaging apparatus comprising:

data acquiring means for acquiring first half echo data in a specific pulse sequence, from a subject to which a static magnetic field, gradient magnetic fields, and radio-frequency electro-magnetic waves have been applied, for inverting polarities of the gradient magnetic fields in the specific pulse sequence, thereby acquiring second half echo data;

data synthesizing means for reversing the second half echo data in a readout direction, and for combining the second half echo data, thus reversed, and the first half echo data, thereby synthesizing full echo data; and image reconstructing means for reconstructing the MR image from the full echo data synthesized by the data synthesizing means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a timing chart, too, showing a second pulse sequence in the first embodiment;

FIG. 8 is a diagram representing the data acquired in the first embodiment;

FIG. 9 is a diagram representing the data generation in the first embodiment;

FIG. 11 is a timing chart illustrating a first pulse sequence in the second embodiment;

FIG. 12 is a timing chart showing a second pulse sequence in the second embodiment;

FIG. 20 is a timing chart illustrating a first asymmetric echo sequence in the fourth embodiment;

FIG. 21 is a timing chart showing a second asymmetric echo sequence of the fourth embodiment;

DETAILED DESCRIPTION OF THE PREFERRED EMBODIMENTS

Figure 4:
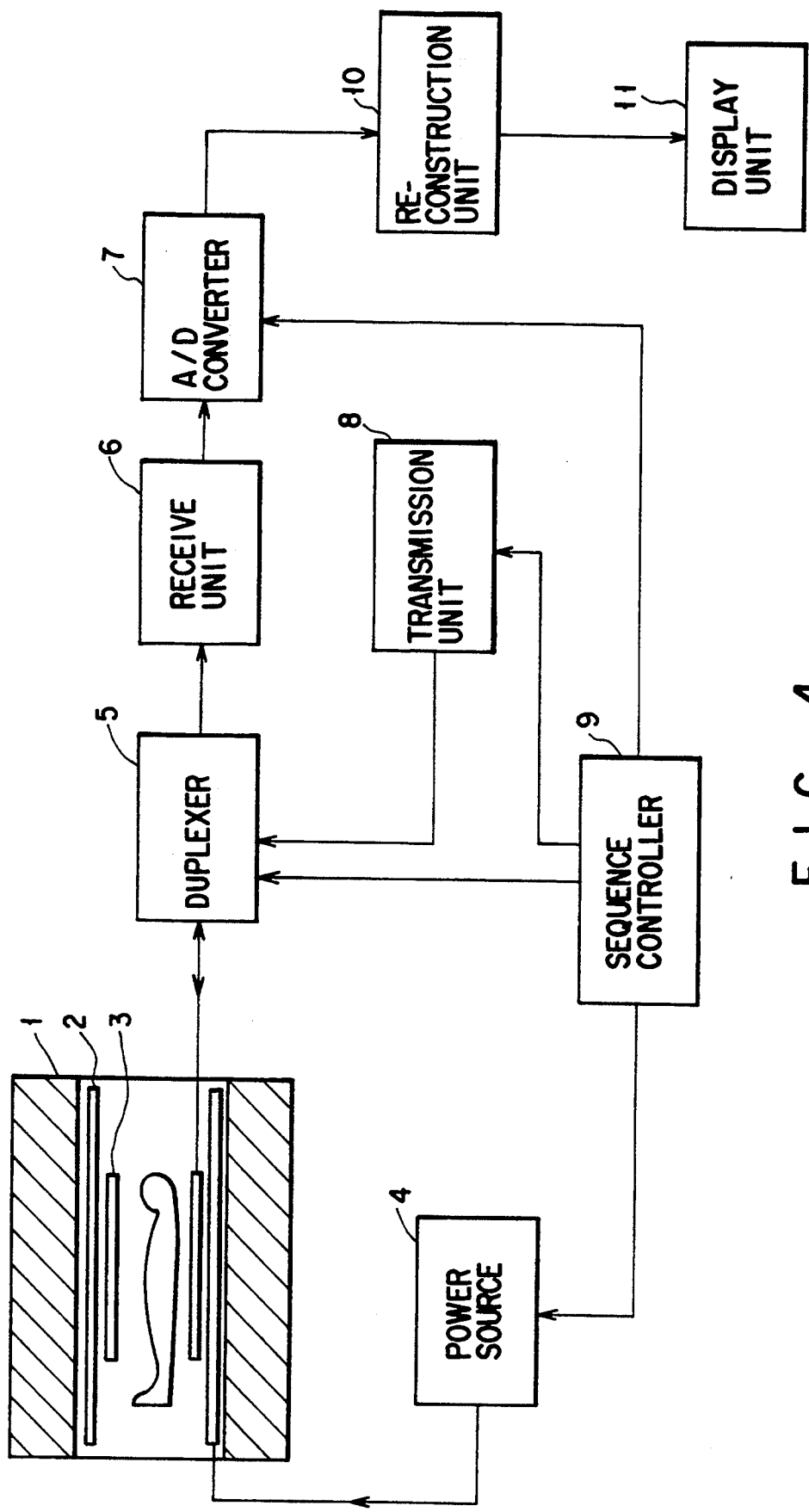
FIG. 4 is a block diagram of a magnetic resonance imaging apparatus of the present invention.

FIG. 4 shows the basic structure common to magnetic resonance imaging apparatus, which are preferred embodiments of the invention. Any magnetic resonance imaging apparatus according to the invention comprises a magnet 1, gradient coils 2, a probe 3, a power source 4, a duplexer 5, a receive unit 6, an analog-to-digital (A/D) converter 7, a transmission unit 8, a sequence controller 9, a reconstruction unit 10, and a display unit 11.

The magnet 1 generates a static magnetic field. The gradient coils 2 generate gradient magnetic fields Gx, Gy and Gz in the X, Y and Z directions of the XYZ coordinate system. These magnetic fields serve as a slice-selection gradient field Ge, a phase encoding gradient field Ge, and a readout gradient field Gr, respectively. The probe 3 generates electromagnetic waves (RF pulses) for excitation of spins and detecting induced magnetic resonance (MR) signals. The power source 4 is provided for driving the gradient coils 2.

The duplexer 5 separates transmit signals (RF pulses) from receive signals (MR signals). The receive unit 6 receives MR signals. The A/D converter 7 converts the MR signals into digital signals. The transmission unit 8 supplies the probe 3 with power for generating RF pulses. The sequence controller 9 activates a predetermined pulse sequence. The reconstruction unit 10 performs image reconstruction processing such as Fourier transformation. The display unit 11 displays images reconstructed by the unit 10.

The present invention is characterized in the operations the sequence controller 9 and the reconstruction unit 10 perform. The sequence controller 9 implements distinctive data acquisition. The reconstruction unit 10 implements distinctive image reconstruction, and drives the power source 4 and the probe 3. In the following description, unless otherwise specified, the kx direction is the readout direction, the ky direction is the phase-encoding direction, and the kz direction is the slice-selection direction.

Figure 5:
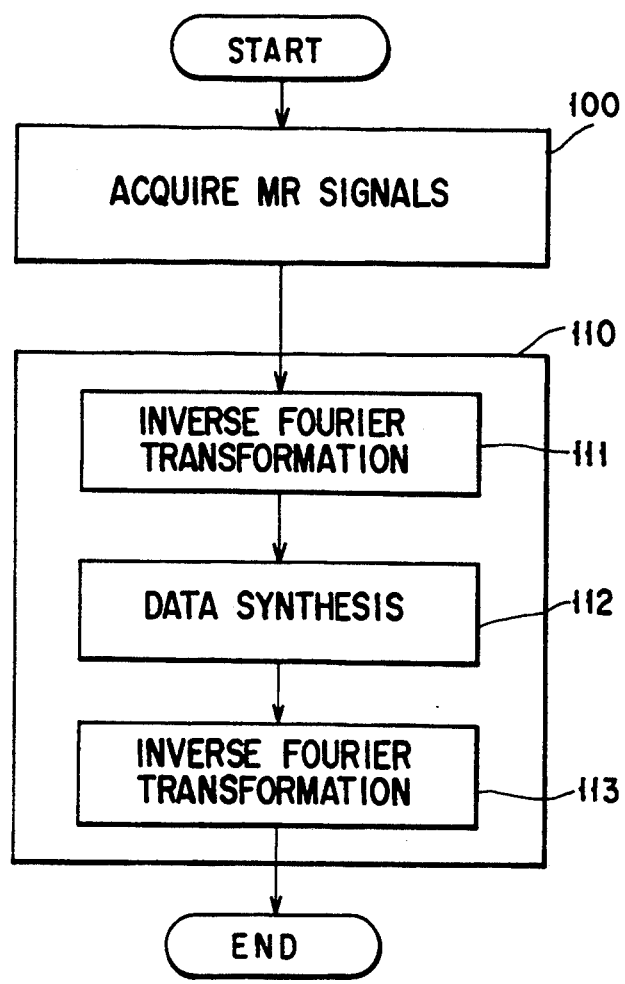
FIG. 5 is a flowchart explaining the operation of the first embodiment of the present invention.

The operation of the first embodiment of the present invention will be described, with reference to FIG. 5. In data acquisition step 100, a magnetic resonance data train in the direction of a specific axis of the X, Y and Z axes and in the direction of a specific polarity is acquired from a subject under examination subjected to a static magnetic field, gradient magnetic fields and RF pulses. Next, in image reconstruction step 110, an MR image of a specific region of the subject is reconstructed from the acquired MR data train. The step 110 comprises inverse Fourier transformation step 111, data synthesis step 112, and inverse Fourier transformation step 113. In inverse Fourier transformation step 111, the MR data train is subjected to inverse Fourier transformation in the directions of other axes than the specific axis. In data synthesis step 112, all data on the k space is synthesized from the data obtained by step 111 and complex conjugate data of that data. In inverse Fourier transformation step 113, the synthetic data acquired in step 112 is subjected to inverse Fourier transformation in the direction of the specific axis. In reconstruction step 110 comprising substeps 111,112 and 113, the image reconstruction time can be reduced to obtain a two-dimensional MR image.

The theoretical principles of the first embodiment described above will be described. A magnetic resonance (MR) signal is generally described as follows:

$$s(kx, ky, kz, t) = \int\int\int\int \rho(z, y, z, \omega) \cdot \exp(-j(kx \cdot x + ky \cdot y + kz \cdot z + \omega \cdot t)) dx dy dz d\omega$$

The inverse Fourier transformation performed in the ky, kz, t directions yields:

$$s'(kx, yo, zo, \omega o) = \int\int\int s(kx, ky, kz, t) \cdot \exp(j(ky \cdot yo + kz \cdot zo + t \cdot \omega o)) dky dkz dt = \int \rho(x, y, z, \omega) \exp(-j(kx \cdot x)) dx \cdot \delta(y - yo) \cdot \delta(z - zo) \cdot \delta(\omega - \omega o)$$

where δ is the Kronecker's delta function.

The complex conjugate of both sides of the above equation is represented by:

$$s'(kx, yo, zo, \omega o)^* = \int \rho(x, y, z, \omega) \cdot \exp(j(kx \cdot x)) dx \cdot \delta(y - yo) \cdot \delta(z - zo) \cdot \delta(\omega - \omega o) = s'(-kx, yo, zo, \omega o)$$

Obviously, s'(kx, yo, zo, wo) has a conjugate relationship with s'(−kx, yo, zo, wo) with respect to the kx=0 plane.

That is, data of kx>0 are acquired. This data is subjected to the inverse Fourier transformation in the ky, kz and t directions. Subsequently, data of kx<0 are created from the inverse Fourier transformed data, using the complex conjugate relational expression. Data of kx<0 and data of kx<0 are thereby obtained. The synthetic data of the kx>0 data and the kx<0 data is subjected to inverse Fourier transformation in the kx direction. This processing reduce the number of Fourier transformation operations required to half since there is only half of data in the ky, kz and t directions. Unlike the conventional method, there is no need to obtain the origin.

Actually, an MR signal is discrete data and the Fourier transformation is a discrete one. Assuming that the numbers of pieces of data in the kx, ky, kz, and t directions are K, L, M, and N, respectively, the number P of basic operations required for Fourier transformation is represented by the following equation, on the assumption that N·log N basic operations must be performed to accomplish fast Fourier transformation on N pieces of data:

$$P = K \cdot L \cdot M \cdot N (\log K + \log L + \log M + \log N)$$

In the present invention, the inverse Fourier transformation can be completed by a number P of operations which is represented by:

$$P = K \cdot L \cdot M \cdot N (\log K + \tfrac{1}{2}\log L + \tfrac{1}{2}\log M + \tfrac{1}{2}\log N)$$

For example, in the case of data in which K=L=M=16 and N=512, the number of operations is only 1/1.68 of that in the conventional method.

The number P of basic operations for three-dimensional data in the conventional method is represented by:

$$P = K \cdot L \cdot M (\log K + \log L + \log M)$$

Figure 6:
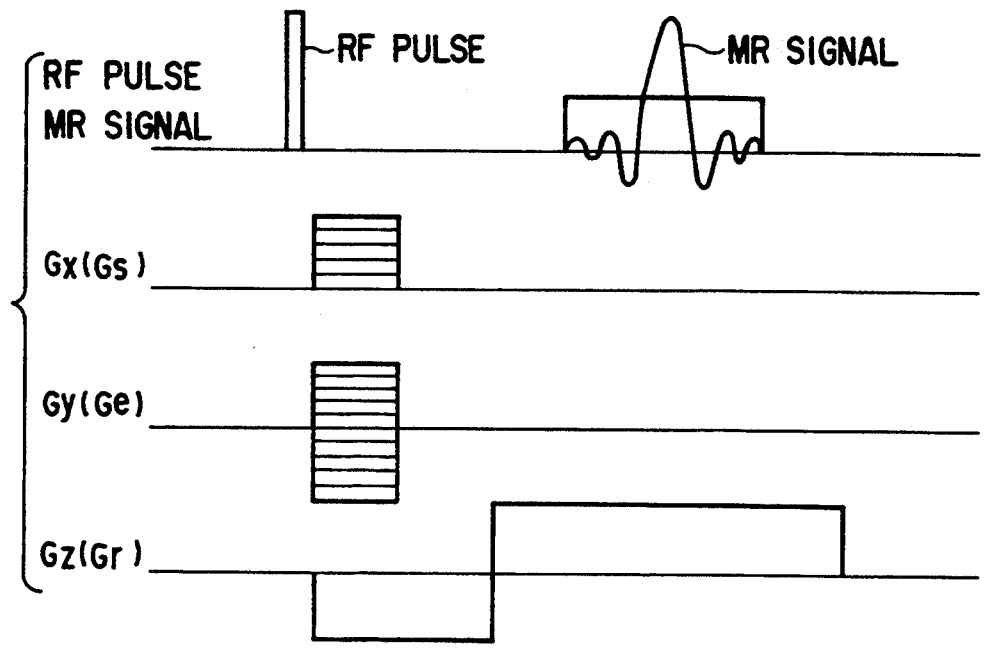
FIG. 6 is a timing chart illustrating a first pulse sequence in the first embodiment.

The first embodiment of the present invention based on the above principle will be described below in detail. The sequence controller 9 executes a pulse sequence shown in FIG. 6 or 7 is executed to acquire MR data. The pulse sequence shown in FIG. 6 is one for three-dimensional field-echo imaging pulses, while the pulse sequence shown in FIG. 7 is one for three-dimensional spin-echo imaging pulses. In these pulse sequences, however, the amount of phase encoding is half the normal phase encoding amount, so as to acquire data from half of the k space. the the field-echo pulse sequence of FIG. 6 serves to acquire the same number of data pieces faster than than the spin-echo pulse sequence of FIG. 7. Therefore, to attain fast image reconstruction and data acquisition, it is necessary to use the field-echo pulse sequence with the technique according to the present embodiment.

In the first embodiment described, the sequence controller 9 performs the three-dimensional field-echo pulse sequence shown in FIG. 6. That is, the subject placed within the magnet 1 is exposed to the slice-selection gradient field Gs, the phase-encoding gradient field Ge and the readout gradient field Gr, all generated by the gradient coils 2, and to the electromagnetic waves (RF pulses) radiating from the probe 3. Thereby, magnetic resonance is induced in a specific region of the subject. MR signals are produced from the magnetic resonance induced region. The receive unit 6 receives the MR signals supplied via the probe 3, and the A/D converter 7 converts the MR signals to digital values.

The first embodiment is designed to perform three-dimensional imaging with a matrix size of 256×256×256. After application of electromagnetic waves (RF pulse) to the subject the phase encoding gradient magnetic field is applied in the Gx, Gy directions. The Z-axis gradient magnetic field Gz is applied as the readout gradient magnetic field at data acquisition time. The three-dimensional field-echo imaging pulse sequence, thus carried out, results in MR signals which are represented by:

$$s(kx, ky, kz) = \int\int\int \rho(x, y, z) \cdot \exp(-j(kx \cdot x + ky \cdot y + kz \cdot z)) dx dy dz$$

In this case, the integration of $\omega$ is omitted.

In this case, since the X-axis gradient magnetic field GX, or the readout gradient magnetic field, is applied only in the positive direction, approximately half as much data as in the conventional full encoding method (refer to FIGS. 2 and 3) is acquired as indicated by oblique lines in FIG. 8. The amount of memory and the data acquisition time required of the reconstruction unit 10 can therefore be halved.

The reconstruction unit 10 first performs inverse Fourier transformation on the acquired data 256×128 times in the ky direction. The inverse Fourier transformation is likewise performed on next acquired data 256×128 times in the kz direction. The data acquired contains only data positive in kx (on the positive side of the kx axis) as indicated in FIG. 8. Therefore, data negative in kx is produced from the data positive in kx as shown in FIG. 9 by utilizing the following conjugate relationship:

$$s'(kx, yo, zo)^* = \int \rho(x, y, z) \cdot \exp(j(kx \cdot x) dx \cdot \delta(y-yo) \cdot \delta(z-zo) = s'(-kx, yo, zo)$$

The inverse Fourier transformation performed on the synthetic full echo data consisting of the actually acquired data positive in kx and the calculation-produced data negative in kx 256×256 times in the kx direction yields data representing a three-dimensional MR image.

In the first embodiment, it suffices to perform inverse Fourier transformation only 131,072 times (=256×128+256×128+256×256). In the conventional method, the inverse Fourier transformation must be performed 196,608 times (=256×256+256×256+256×256). Apparently, the number of operations in the present embodiment is reduced to ⅔ of that in the conventional method.

In imaging a human body, the magnetic field inhomogeneity due to difference in magnetic susceptibility among tissues affects measured signals S. A signal S affected by the magnetic field inhomogeneity is represented by the following equation. (The shift in the readout direction, due to the magnetic field in homogeneity, is not omitted from the equation since it is small.)

$$s(kx, ky, kz) = \int\int\int \rho(x, y, z) \cdot \exp(-j(kx \cdot x + ky \cdot y + kz \cdot z + \gamma \cdot \beta(x, y, z) \cdot \Delta t') dx dy dz$$

As can be seen, the signal S affected by the magnetic field inhomogeneity has no complex conjugate relationship. Inevitably, an artifact will occur in the direction in which data is reflected. To reduce the artifact, it suffices to compensate for the phase of data after Fourier transformation. Data S' after Fourier transformation in the directions of two axes is represented by:

$$s'(kx, yo, zo) = \int \rho(x, yo, zo) \cdot \exp(-j(kx \cdot x + \gamma \cdot \beta(x, yo, zo) \cdot \Delta t')) dx$$

When resolving the magnetic field inhomogeneity B(x, yo, zo) into x-independent magnetic field inhomogeneity B1(yo, zo) and x-dependent magnetic field inhomogeneity B2(x, yo, zo), the data S' is expressed by $$s'(kx, yo, zo) = \int \rho(x, yo, zo) \cdot \exp(-j(kx \cdot x + \gamma \cdot B2(x, yo, zo) \cdot \Delta t')) dx \cdot \exp(-j \cdot \gamma \cdot B1(yo, zo) \cdot \Delta t')$$

Further, the magnetic field inhomogeneity in the plane of kx=0 is represented by $$S'(o, yo, zo) = \int \rho(x, yo, zo) \cdot \exp(-j(\gamma \cdot B2(x, yo, zo) \cdot \Delta t')) dx \cdot \exp(-j \cdot \gamma \cdot B1(yo, zo) \cdot \Delta t)$$

That is, in the presence of magnetic field inhomogeneity, the phase is not 0 at any point on the kx =0 plane. When data in the negative direction of kx is produced using the conjugate relationship of S', the phase becomes discontinuous in the kx=0 plane, which causes artifacts in the direction in which data is reflected (in this case, the x direction).

The phase distribution O(yo, zo) of S'(o, yo, zo) in the kx=0 plane is measured and compensated for as follows:

$$S'(kx, yo, zo) = s(kx, yo, zo) \exp(-j(\Theta(yo,zo)))$$

This compensation eliminates the phase discontinuity. The artifacts caused by phase discontinuity is thereby removed. Note that the compensation method cannot compensate for phase distortion and artifacts due to the magnetic field inhomogeneity B2(x, yo, ZO).

In actual phase compensation, phase data on axes orthogonal to a specific axis (in this case, the y, z axes) is used to avoid phase compensation errors arising from noise. For each axis, phase compensation is made using phase compensation values approximated by a first-degree or second-degree function.

It has been described how the first embodiment processes three-dimensional imaging data. Nonetheless, the embodiment can process two-dimensional imaging data, three-dimensional chemical shift imaging data, and four-dimensional chemical shift imaging data, by performing inverse Fourier transformation a smaller number of times.

Figure 10:
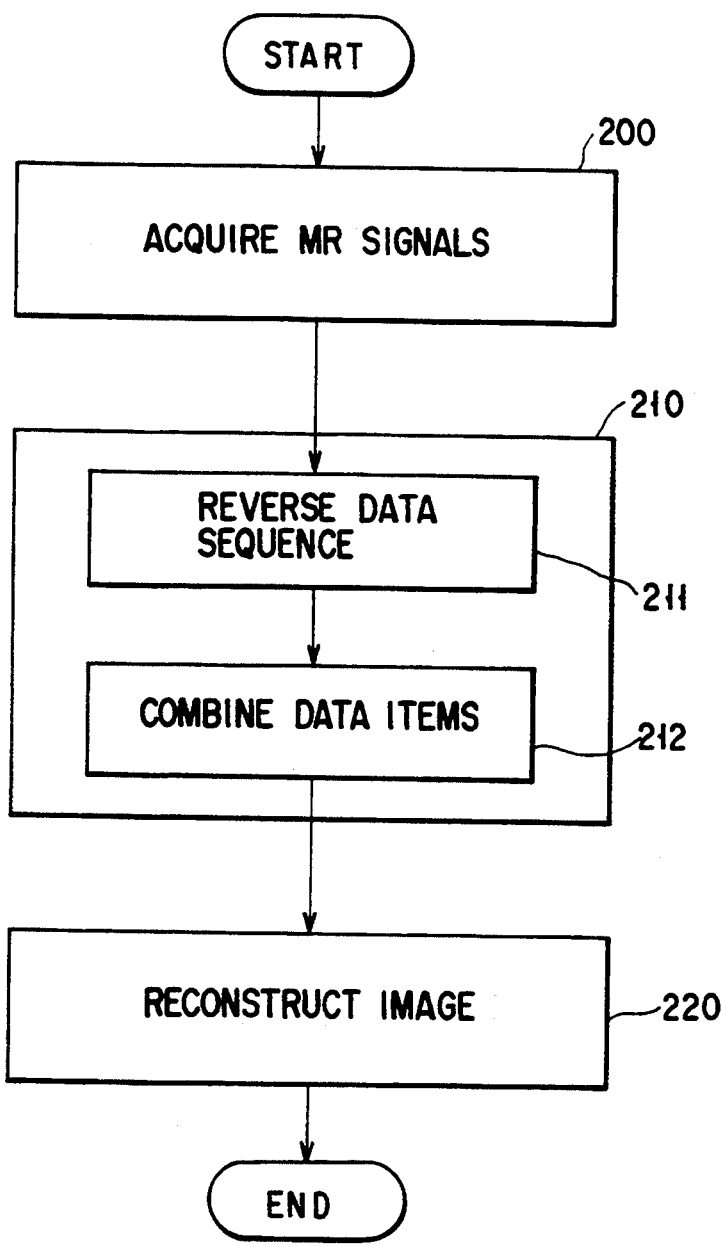
FIG. 10 is a flowchart explaining the operation of a second embodiment of the present invention.

A second embodiment of the present invention will be described next. How the second embodiment processes data will be described, with reference to the flow chart of FIG. 10. In data acquisition step 200, the first half of echo data is acquired from a patient placed in a static magnetic field, gradient magnetic fields and exposed to an RF pulse, in accordance with a specific pulse sequence. Then, in step 200, the second half of the data is acquired next by inverting the polarity of the readout gradient magnetic field in the said pulse sequence.

In data synthesis step 210, full echo data is synthesized. The step 210 comprises data arrangement reversing step 211 and data combining step 212. In data arrangement reversing step 211, the second half echo data is reversed in the readout direction. In data synthesis step 212, the second half echo data, thus reversed, and the first half echo data are synthesized into full echo data. Subsequently, reconstruction step 220 is carried out. In reconstruction step 220, an MR image is reconstructed from the full echo data prepared by data synthesis step 210.

Hereinafter, the theoretical principles of the second embodiment will be described.

Figure 1:
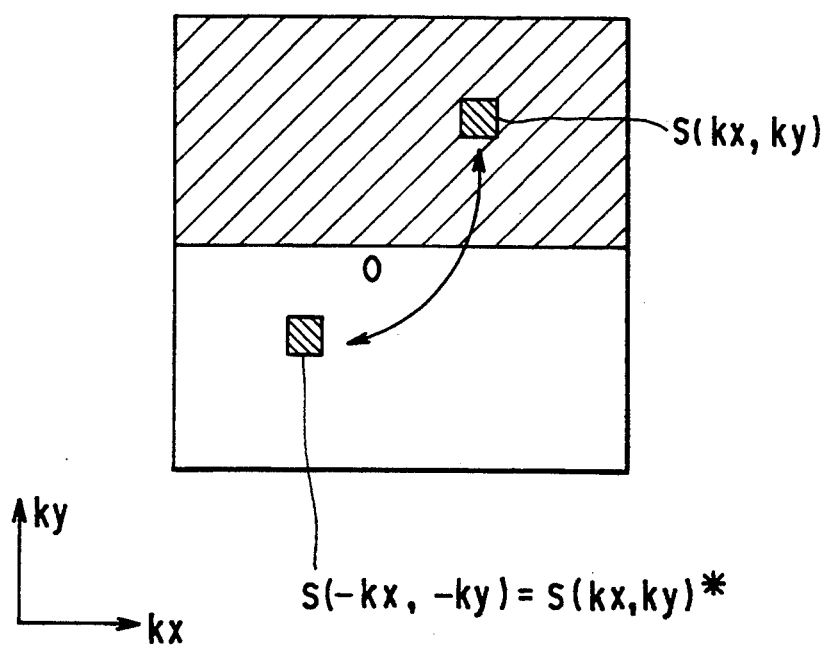
FIG. 1 is a schematic representation of conventional data generation to be compared with a first embodiment of the present invention.
Figure 2:
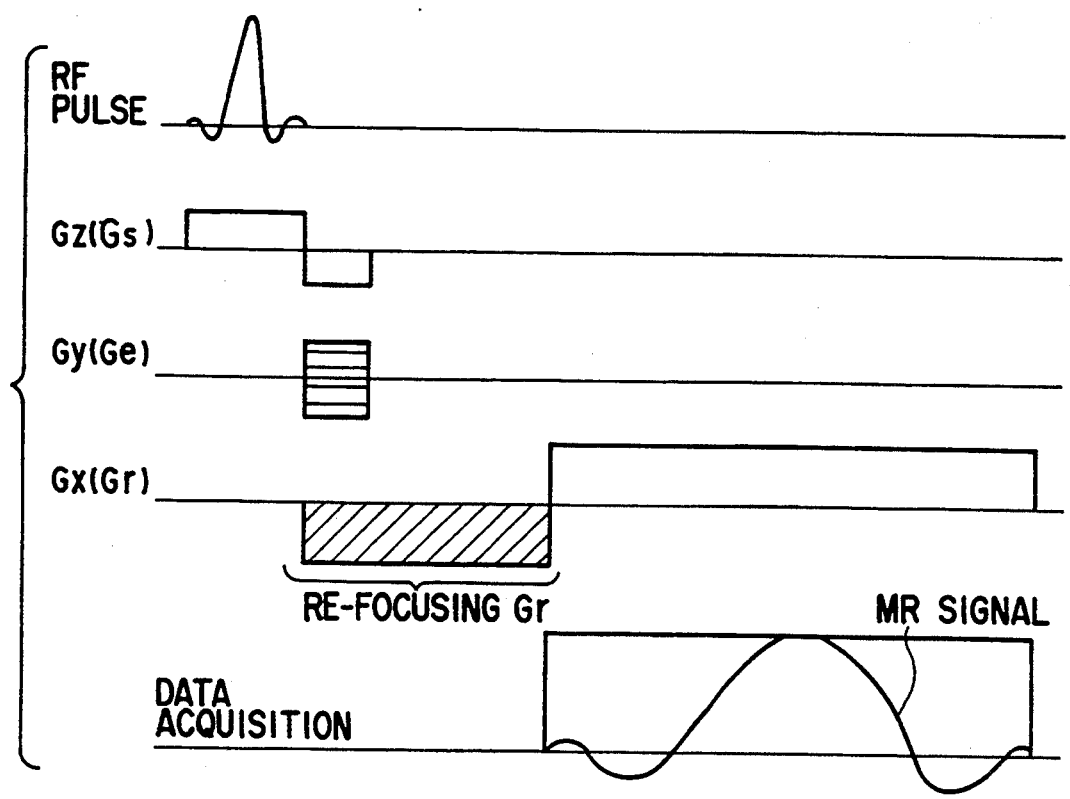
FIG. 2 is a timing chart illustrating a conventional pulse sequence.
Figure 3:
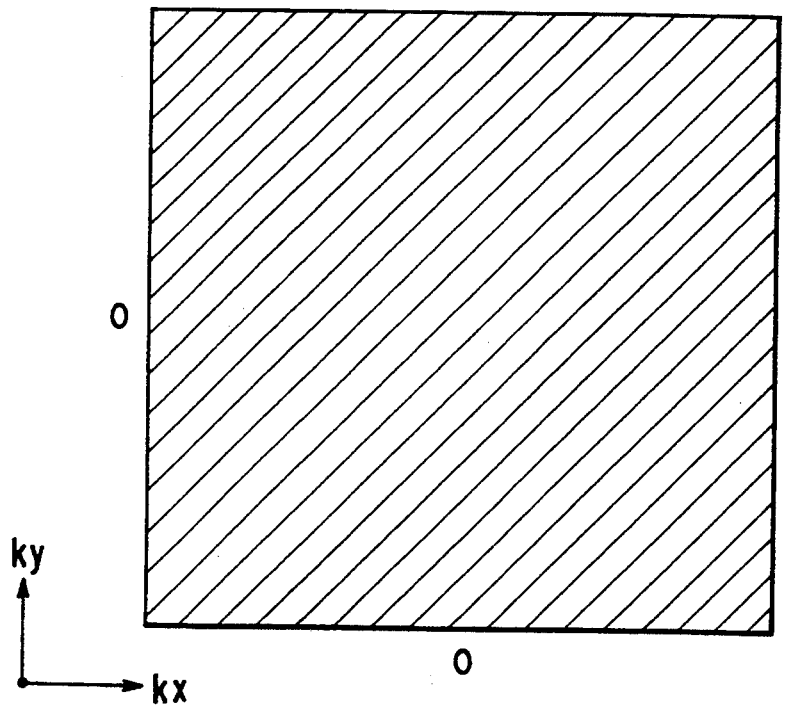
FIG. 3 is a diagram representing the data obtained by the conventional pulse sequence.

In the conventional two-dimensional filed-echo pulse sequence shown in FIG. 2, magnetic resonance signals S are described as follows.

$$S(kx, ky) = \int\int \rho(x, y) \cdot \exp(-j(kx \cdot x + ky \cdot y))dxdy (kx \geq 0)$$

The inverse Fourier transformation of the signal train S(kx, ky) produces an MR cross-sectional image. An asymmetric echo sequence of FIG. 11 according to the second embodiment is advantageous in that the echo time TE is short because the re-focusing readout gradient magnetic field is not used in this sequence.

Also, a pulse sequence shown in FIG. 12 may be used. In this case, however, data can be taken in the positive direction of kx, but data cannot be taken sufficiently in the negative direction of kx. For this reason, it is necessary to create data in the negative direction of kx using some method.

In a pulse sequence wherein the readout gradient magnetic field is reversed, signals S are represented by $$S(t,GE) = \int\int \rho(x, y) \cdot \exp(-j\gamma(GXx \cdot t + GYy \cdot \Delta t))dxdy$$

For $r \cdot Gx \cdot x \cdot t = kx'$ and $r \cdot Gy \cdot y \cdot \Delta t = ky$, the above equation transforms to:

$$S(kx', ky) = \int\int \rho(x, y) \cdot \exp(-j(-kx' \cdot x + ky \cdot y))dxdy (kx' \geq 0)$$

Further, for $kx = -kx'$, the following equation results:

$$S(kx, ky) = \int\int \rho(x, y) \cdot \exp(-j(kx \cdot x + ky \cdot y))dxdy (kx \leq 0)$$

Data can thereby be taken in the negative direction of kx. In actual operation, the field-echo pulse sequence shown in FIG. 11 is used to acquire data. By inverting the polarity of the readout gradient magnetic field, this pulse sequence can be used to acquire half echo data. The spin-echo pulse sequence shown in FIG. 12 can, of course, be used for data acquisition. In this case, the field-echo pulse sequence contributes to the shortening of data acquisition time.

First, the sequence (arrangement) of data in the direction kx acquired by the field-echo pulse sequence of FIG. 11 is reversed. Next, data obtained by the half echo sequence in which the polarity of the readout gradient magnetic field is not reversed, and the sequence-reversed data are combined to produce full echo data. Subsequent inverse Fourier transformation of the full echo data permits a cross-sectional MR image to be obtained.

A method of producing full echo data from half echo data utilizing the complex conjugate property is available. In this method, the complex conjugate of both sides of the following signal S is taken, thus yielding:

$$S(kx, ky) = \int\int \rho(x, y) \cdot \exp(-j)(-kx \cdot x - ky \cdot y))dxdy = S(-kx, -ky)(kx \geq 0)$$

Data in the negative direction of kx is thereby obtained. However, this method cannot be used to reconstruct MR images requiring phase information such as phase contrast angiography. Here, the following signal is presented.

$$S(kx, ky) = \int\int \rho(x, y) \cdot \exp(-j(kx \cdot x + ky \cdot y + \Theta(x, y)))dxdy$$

Taking complex conjugate of this expression yields:

$$S(kx, ky) = \int\int \rho(x, y) \cdot \exp(-j(-kx \cdot x - ky \cdot y - \Theta(x, y)))dxdy \neq S(-kx, -ky)$$

From this it follows that data in the negative direction of kx cannot be obtained. In the present method, the signal is transformed as specified below when the readout gradient magnetic field is not inverted in polarity:

$$S(kx, ky) = \int\int \rho(x, y) \cdot \exp(-j(kx \cdot x + ky \cdot y + \Theta(x, y)))dxdy (kx' \geq 0)$$

The signal is transformed as shown below when the read gradient magnetic field is inverted in polarity:

$$S(kx', ky) = \int\int \rho(x, y) \cdot \exp(-j(-kx' \cdot x + ky \cdot y + \Theta(x, y)))dxdy (kx' \geq 0)$$

Assuming $kx = -kx'$, then:

$$S(Kx, ky) = \int\int \rho(x, y) \cdot \exp(-j(kx \cdot x + ky \cdot y + \Theta(x, y)))dxdy (kx \leq 0)$$

This is how data in the negative direction of kx can be obtained.

It will now be explained how the second embodiment of the invention operate on the theoretical principles described above. First, the sequence controller 9 performs the field-echo pulse sequence of FIG. 11 in order to form a two-dimensional MR image. More precisely, the controller 9 supplies a selective excitation RF pulse is supplied to the power source 4, thereby exciting the spins in a specified region of the subject and applying a phase encoding gradient magnetic field to that region. Thereafter, a readout gradient magnetic field is applied to the specific region of the subject. The readout gradient magnetic field includes no re-focusing gradient magnetic field, unlike in the conventional two-dimensional filed-echo pulse sequence shown in FIG. 2. Hence, if data is acquired in the pulse sequence shown in FIG. 11 in the second embodiment, it is no more than half the data corresponding to the k space, i.e., the portion shaded in FIG. 13. In other words, data can be acquired from the k space only in the positive direction of kx of the readout gradient magnetic field because no re-focusing gradient magnetic field is applied at all. Hence:

$$S(kx, ky) = \int\int \rho(x, y) \cdot \exp(-j(kx \cdot x + ky \cdot y))dxdy (kx \geq 0)$$

where $\rho(x, y)$ is a spin density function, kx is the read-encoded amount, $kx = \gamma Gx \, t$ ($t \geq 0$, t being the data acquisition time), and ky is the phase-encoded amount, $ky = \gamma Gy \, \Delta t$.

Figure 13:
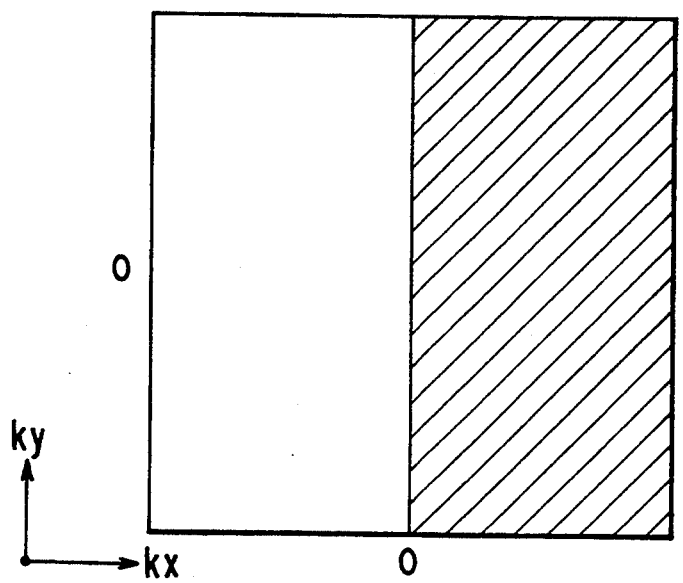
FIG. 13 is a diagram representing the data acquired in the second embodiment.
Figure 14:
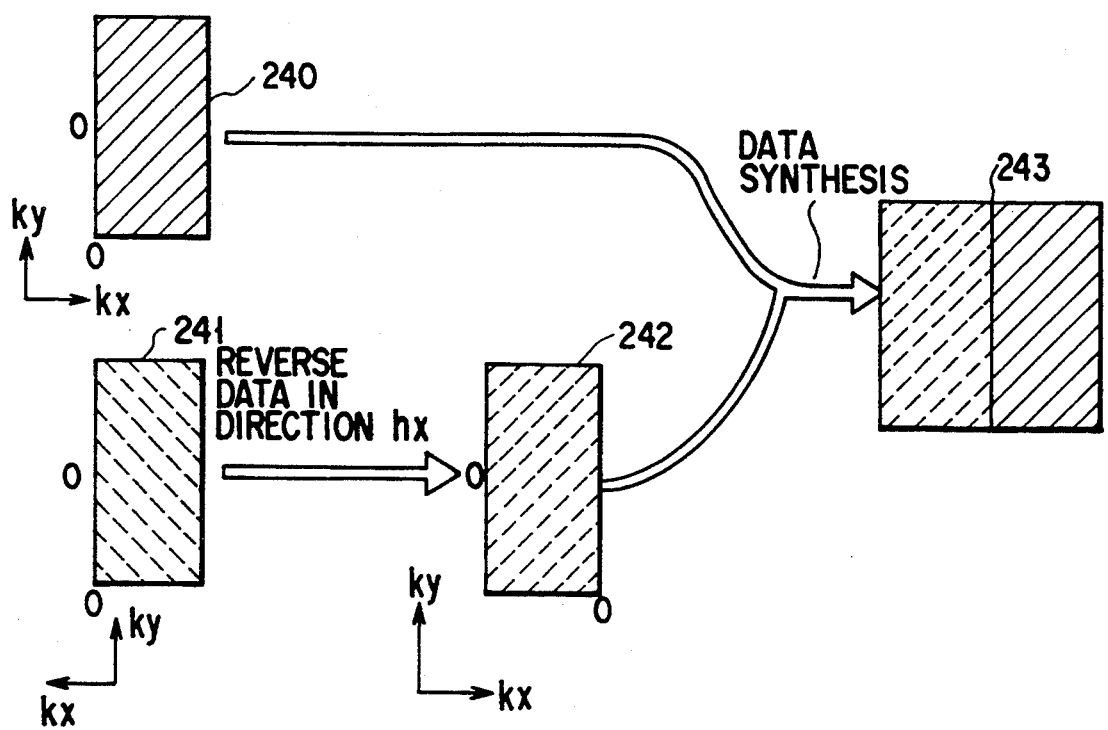
FIG. 14 a diagram explaining how an image is reconstructed by using the data train obtained from the pulse sequence in the second embodiment.
Figure 15:
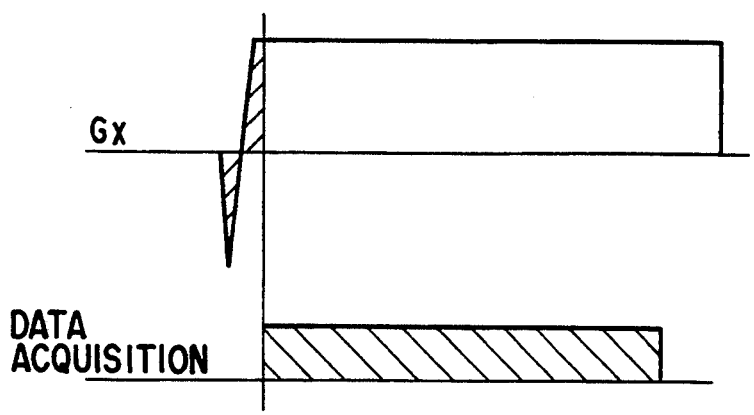
FIG. 15 is a diagram explaining, in detail, a readout gradient magnetic field in the pulse sequence in the second embodiment.

If the sequence, in which the readout gradient magnetic field is inverted as indicated by the broken lines in FIG. 11, is applied, the data will be acquired which represents the negative part of kx, or the shaded part shown in FIG. 13. This data is given as:

$$s'(kx', ky) = \iint \rho(x, y) \cdot \exp(-j(-kx' \cdot x + ky \cdot y))dxdy (kx \geq 0)$$

where kx is the read-encoded amount, $kx' = \gamma \cdot Gx \cdot t$ ($t \geq 0$, t being the data acquisition time).

The data, thus acquired, is inverted in the kx direction (kx = − KX′), whereby the data representing the shaded part shown in FIG. 13 is obtained, which is given as:

$$S(kx, ky) = \iint \rho(x, y) \cdot \exp(-j(kx \cdot x + ky \cdot y))dxdy (kx \geq 0)$$

Two data items, which differ in readout gradient magnetic field, are synthesized into full echo data. The full echo data is subjected to inverse Fourier transformation, whereby an MR image is reconstructed.

In the description related to FIG. 11, the power output by the power source 4 is assumed, for simplicity of description, to instantaneously change. In fact, however, it takes about several micro-hundreds second for the power source 4 to change the output power. It is therefore necessary to change the polarity of the readout gradient magnetic field prior to the data acquisition and to start collecting data after the gradient magnetic field becomes stable.

Figure 16:
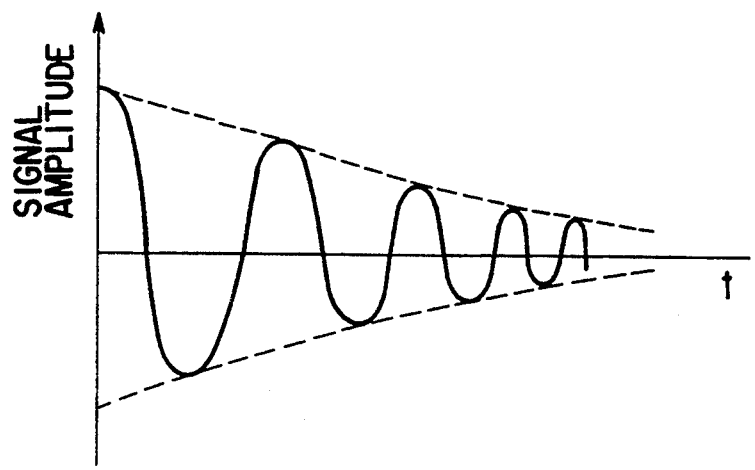
FIG. 16 is a diagram representing the attenuation of a signal.

As illustrated in FIG. 16, the MR signal is attenuated due to the relaxation time and the magnetic field inhomogeneity (i.e., the magnetic field inhomogeneity within a boxel, during the imaging process). Nonetheless, since the time elapsing from the spin excitation to the data acquisition is shortened in the second embodiment, the signal attenuation is so small that an image with a high S/N ratio will be reconstructed. Image S/N ratio is low in most magnetic resonance imaging methods for a resolution as high as 100 μm. In view of this, the data-acquiring method used in the second embodiment is advantageous.

Figure 17:
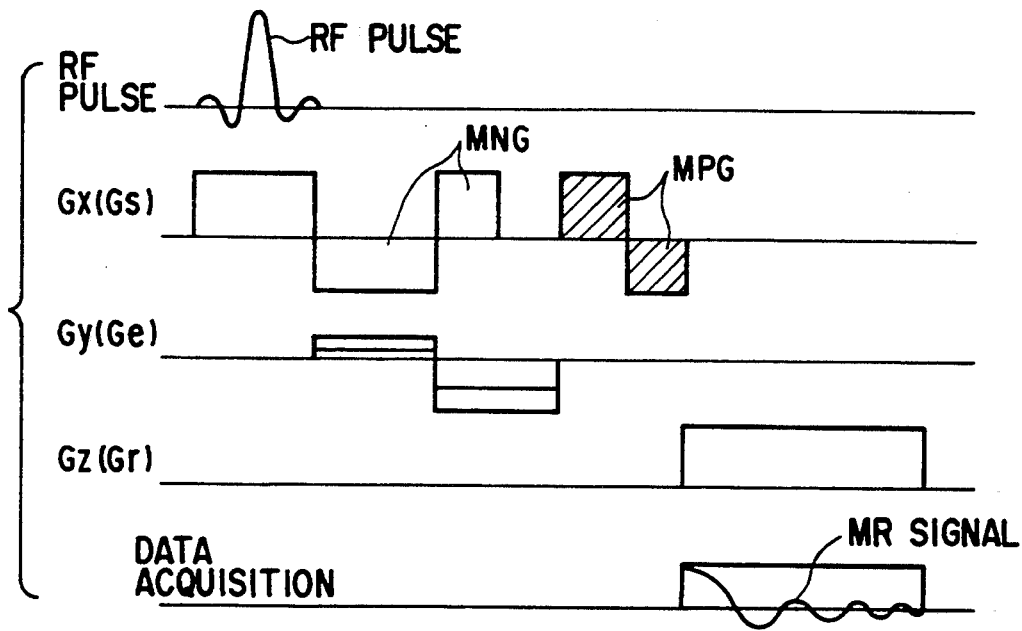
FIG. 17 is a timing chart illustrating a first pulse sequence in a third embodiment of the present invention.
Figure 18:
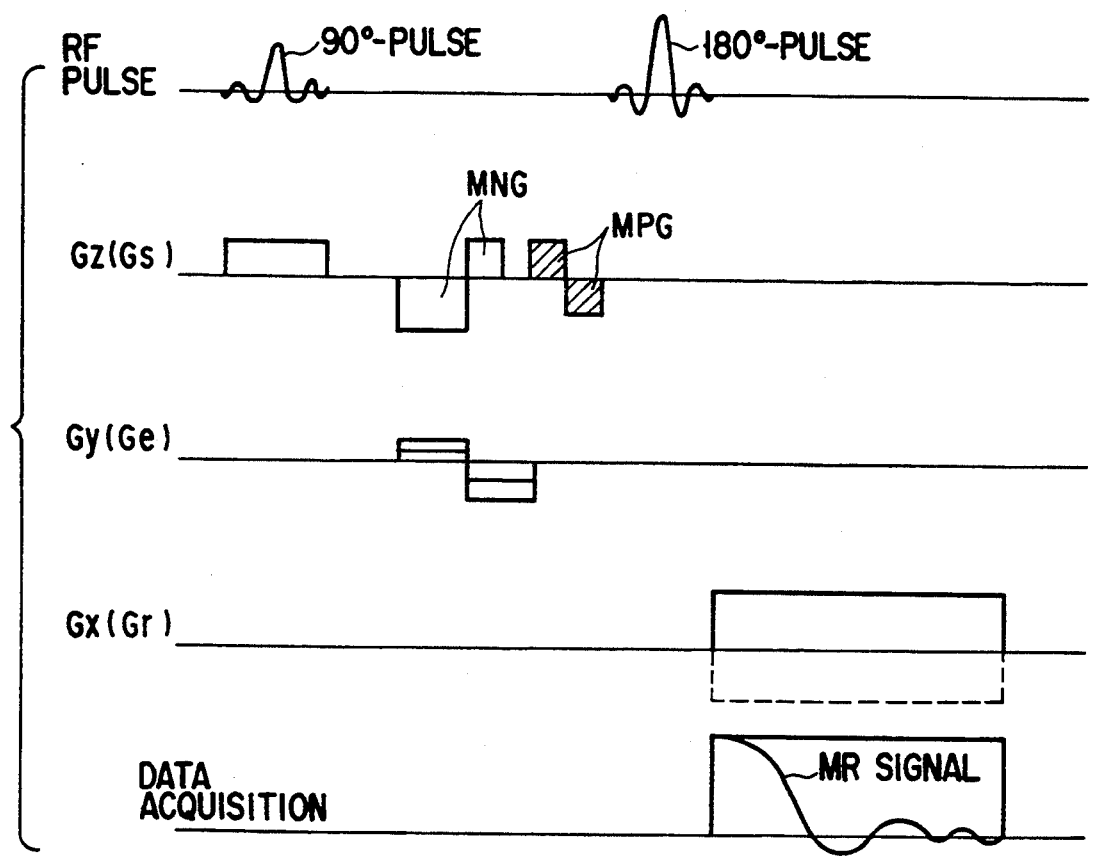
FIG. 18 is a timing chart illustrating a second pulse sequence in the third embodiment.
Figure 19:
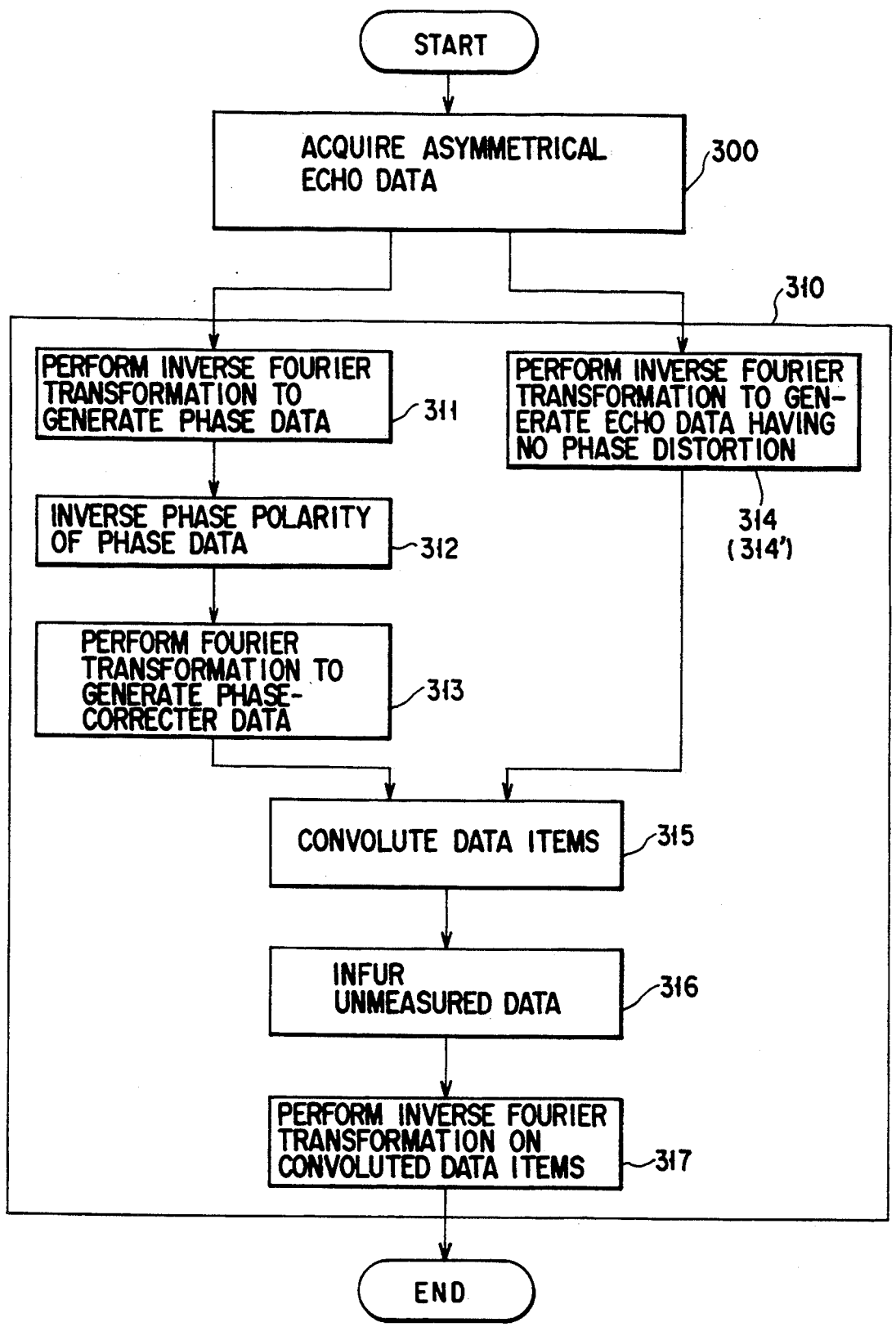
FIG. 19 is a flow chart explaining the operation of a fourth embodiment of the present invention.
Figure 22:
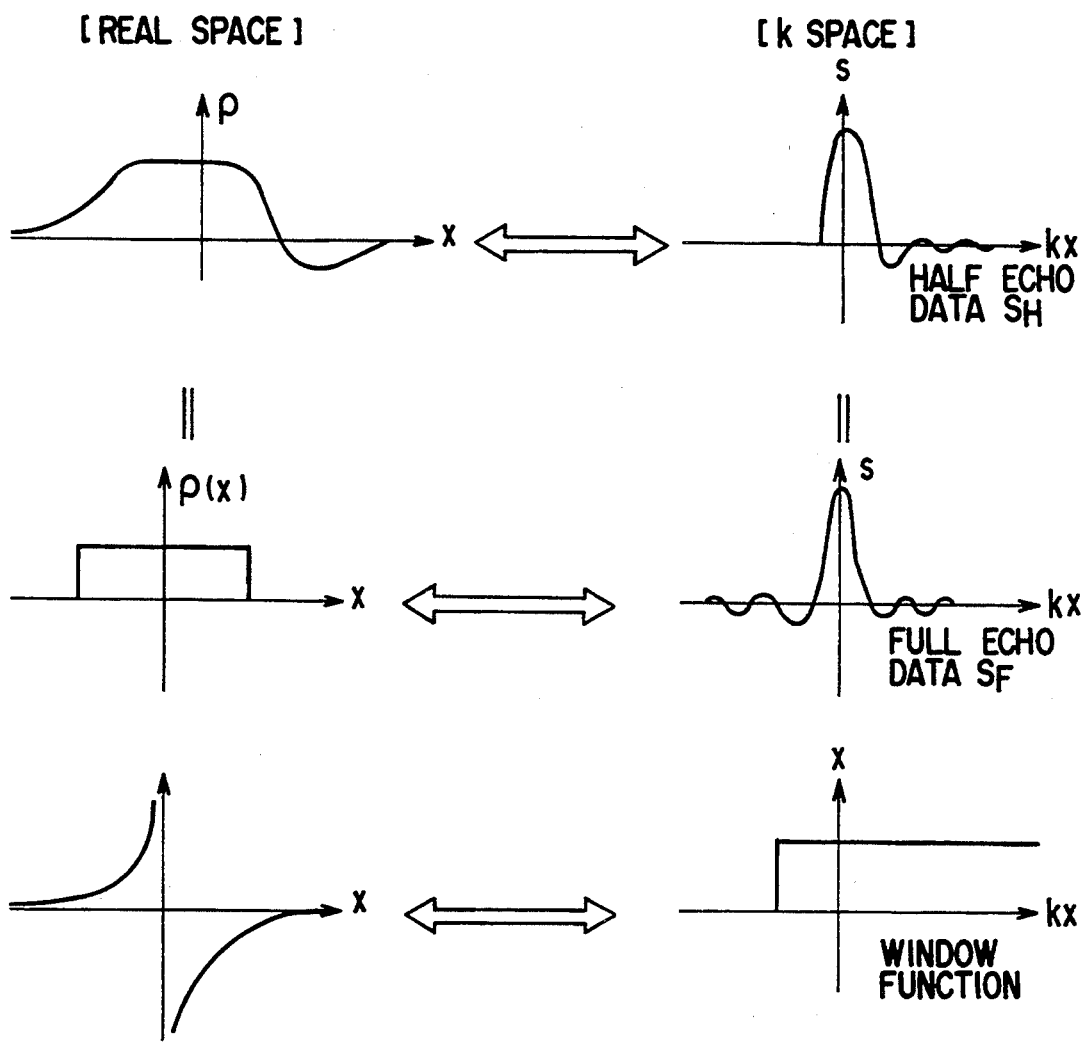
FIG. 22 is a diagram illustrating the window functions in real space and k space.

The third embodiment of the present invention will now be described, with reference to FIG. 17 which illustrates the pulse sequence utilized in this embodiment. The pulse sequence shown in FIG. 17 is a modified field-echo pulse sequence. Use of the pulse sequence shown in FIG. 17 makes it possible to acquire data at high speed. In addition to the pulse sequence of FIG. 17, use can be made of another pulse sequence shown in FIG. 18, which is a modified spin-echo pulse sequence.

The third embodiment can be employed to visualize fluid such as blood or to measure the flow rate of fluid. The pulse sequence shown in FIG. 17 is applied in phase contrast angiography in which flow rate data is obtained from phase-related data. More specifically, a spin-exciting RF pulse is supplied to a subject, along with a slice-selection gradient field Gs (Gx), thereby exciting the spins in a specific slice region of the subject. Then, a gradient magnetic field Gx, or a combination re-focusing gradient magnetic field and moment mulling gradient (MNG) magnetic field, is applied to he subject. Further, a phase-encoding gradient field Ge (Gy) and a readout gradient field Gr (Gz) are applied to the subject. Still further, a motion probing gradient (MPG) magnetic field, which is shaded in FIG. 17, is applied as Gx to the subject. The signal radiating from any spin that to move is described as:

$$S(kx, ky) = \iint \rho(x, y) \cdot \exp(-j(kx \cdot x + ky \cdot y))dxdy (kx \geq 0)$$

where ρ (x, y) is a spin density function, kx is the read-encoded amount, $kx = \rho \cdot Gx \cdot t$ ($t \geq 0$, t being the data acquisition time), and ky is the phase-encoded amount, $ky = \rho \cdot Gy \cdot \Delta t$.

Any signal radiating from any moving object, such as the blood flowing in a blood vessel, is not described by the equation set forth above, but does have a specific phase. Stated more precisely, the signal radiating from a spin moving in the X direction at speed V has a phase of $\Theta = \gamma \cdot Gy \cdot V \cdot \Delta t^2$. The $\Delta t''$ is the pulse wide of the MPG. Thus, the signal S radiating from a moving spin is represented by the following equation:

$$S(kx, ky) = \iint \rho(x, y) \cdot \exp(-j(kx \cdot x + ky \cdot y + \Theta(x, y)))dxdy$$

If such signals are processed by the conventional Half Fourier method to reconstruct an image, large artifacts will occur due to the phase terms included in each signal. Consequently, the image cannot be reconstructed faithfully.

As has been indicated, the pulse sequence shown in FIG. 17 is applied in the third embodiment of the invention. Since the readout gradient magnetic field Gr is inverted in this pulse sequence, the signal S radiating from a moving spin is represented by the following equation:

$$S(kx', ky) = \iint \rho(x, y) \cdot \exp(-j(-kx' \cdot x + ky \cdot y + \Theta(x, y)))dxdy (kx' \geq 0)$$

Assuming that $kx = -kx'$, then:

$$S(kx, ky) = \iint \rho(x, y) \cdot \exp(-j(kx \cdot x + ky \cdot y + \Theta(x, y)))dxdy(kx' \leq 0) .$$

Obviously, the data in the negative direction of kx can be obtained.

Thus, the third embodiment can successfully applied to the data of phase contrast angiography, from which an image cannot be reconstructed by the conventional Half Fourier method. Moreover, in the third embodiment, the time elapsing from the spin excitation to the echo peak is short. As a result, an image will be reconstructed which has so high a an S/N ratio as to visualize even very slender blood vessels.

In the third embodiment, the signal attenuates only a little as described above, because of the short time which elapses from the spin excitation to the echo peak. Hence, a high S/N ratio image can be reconstructed. In addition, the third embodiment can be applied to phase-related data such as that of phase contrast angiography, making it possible to visualize even very slender blood vessels.

The fourth embodiment of this invention will now be described, with reference to FIGS. 19 to 23. As shown in the flow chart of FIG. 19, the imaging apparatus according to the fourth embodiment operates in two main steps, i.e., data acquisition step 300 and data-producing/image-reconstruction step 310.

In step 300, the imaging apparatus acquires asymmetrical echo data from a subject to which a static magnetic field, gradient magnetic fields and high-frequency pulses are applied. The asymmetrical echo data consists of half-echo data relating to the k space and center echo data relating to the center of the k space.

The data-producing/image-reconstruction step 310 comprises inverse Fourier transformation step 311, phase-polarity inverting step 312, Fourier transformation step 313, inverse Fourier transformation step 314, convolution step 315, data-inferring step 316, and inverse Fourier transformation step 317.

In step 311, the apparatus performs inverse Fourier transformation on the center echo data, generating phase data. In step 312, the apparatus inverts the phase polarity of the phase data, which has been inverted by the inverse Fourier transformation performed in step 311. In step 313, the apparatus performs Fourier transformation on the phase data generated in step 312, in the readout direction.

Meanwhile, in step 314, the apparatus effects inverse Fourier transformation on all asymmetrical echo data acquired in step 300, in the encoding direction. In step 315, the apparatus convolute the correcting phase data and the echo data, thereby producing echo data having nophase distortion. In step 316, the apparatus infers echo data from the data convoluted in step 315, utilizing the complex conjugate property of the echo data already acquired. In step 317, the apparatus applies inverse Fourier transformation to the convoluted data and the inferred data, in the readout direction. As a result, an MR image of a specific region of a subject is reconstructed from the asymmetrical echo data acquired in step 300.

The theoretical principles of the fourth embodiment will be described. The Half Fourier method described above cannot completely eliminate phase distortion, if any, resulting from magnetic field inhomogeneity. Consequently, artifacts will occur inevitably. In order to eliminate the phase distortion, the data can be processed at lower speeds, in the following way.

For the sake of simplicity, it will be described how to process a one-dimensional signal. First, asymmetrical echo data is acquired by using the asymmetrical echo sequence shown in FIG. 20 or the asymmetrical echo sequence shown in FIG. 21.

Generally, the image data is in the extence of a phase distortion $\Theta(x)$ resulting from magnetic field inhomogeneity, the following relation ship is observed:

$$\rho'(x) = \rho(x) \cdot \exp(j\Theta(x)) \quad (A)$$

where $\rho'(x)$ is image data obtained by performing inverse Fourier transformation on all data acquired from the k space, $\rho(x)$ is a function proportional to the spin density, and $e^{j\Theta(x)}$ is phase distortion resulting from magnetic field inhomogeneity or the like.

Phase distortion $\Theta(x)$ resulting from magnetic field inhomogeneity or the like changes only slowly in a real space. Phase data $e^{j\Theta(x)}$ can therefore be obtained by reconstructing the data acquired from the vicinity of the origin in the K space.

It should be noted that full echo, asymmetrical echo, and the near-origin data are represented as:

Full echo: $S(kx)$, $\infty \leq kx \leq \infty$
Asymmetrical echo: $S(kx)$, $-ko \leq kx \leq \infty$
Near-origin data: $S(kx)$, $-ko \leq kx \leq ko$ In the case of full echo data which can be acquired from the whole k space, the image data $\rho'(x)$ is multiplied by the polarity-inverted phase data. In this case, the acquisition of MR signal is finitness. That is:

$$\rho'(x)e^{j\Theta(x)} = \rho(x) \cdot e^{j\Theta(x)} \cdot e^{-j\Theta(x)} = \rho(x) \quad (B)$$

In the case of half echo data or asymmetrical echo data, however, data cannot be acquired from the entire k space. Hence, in the k space, the image data $\rho'(x)$ is multiplied by the window function shown in FIG. 22.

When the half echo data or the asymmetrical echo data is reconstructed, the data does not become such a simple function as represented by the equation (A). Rather, the data becomes a convoluted function $W(x)$ which has been obtained by performing Fourier transformation on the data of the equation (A) and the window function $w(x)$. Obviously it is impossible to eliminate the phase distortion by such a simple method as is identified by the equation (B).

To eliminate the phase distortion, the phase data $e^{j\Theta(x)}$ is inverted in polarity, obtaining data $e^{-j\Theta(x)}$. Then, the data $e^{-j\Theta(x)}$, thus obtained, is subjected to Fourier transformation, thereby obtaining data $\Theta(kx)$. The data $\Theta(kx)$ and the measured MR signal $S'(kx)$ are convoluted. This data convolution in the k space is equivalent to a multiplication in a real space, i.e., the multiplication of image data $\rho'(x)$ by the data $e^{-j\Theta(x)}$. As a result, data is acquired from the k space, which is equivalent to data $R(kx)$ having no phase distortion and obtained by Fourier-transforming the function $\rho(x)$.

As indicated above, half echo data or asymmetrical echo data cannot be acquired in its entirety from the k space. Whether or not this fact results in any disadvantage will be discussed, assuming that the phase-correcting data $\Theta(kx)$ has a low-frequency component only. On this assumption, the data convolution is represented as follows:

$$\Theta(kx) = f(kx) \quad (-Ko \leq kx \leq ko)$$
$$o = (kx < -ko, ko \leq kx)$$
$$S''(k) = \int \Theta(k') \cdot s'(kx - k')dk'$$
$$= \int f(k') \cdot s'(kx - k')dk'$$

In the case of the asymmetrical echo data, the signal $S'(kx)$ is measured exclusively in the value of $-ko \leq kx$. The convoluted function $S''(kx)$ is, therefore, correct for the range of $kx \geq$. Since the function $S''(kx)$ is free of phase distortion, the unmeasured echo data is generated by utilizing the complex conjugate property of the echo data already acquired. The unmeasured echo data, thus generated, and the echo data already obtained are synthesized, forming synthesized data. The synthesized data is subjected to inverse Fourier transformation, thereby obtaining an image not affected by phase distortion and having no artifacts.

It will be described how the fourth embodiment actually operates to process a two-dimensional signal. First, asymmetrical echo data is acquired by using the pulse sequence shown in FIG. 19. To reconstruct a two-dimensional image having a matrix size of 256×256, data is acquired from (128+8)×256 points in a k space. Next, 16×256 bits acquired from the center of the k space are subjected to inverse Fourier transformation, thereby obtaining phase data $e^{j-\Theta(X,Y)}$. The phase data $e^{j-\Theta(X,Y)}$ is inverted in its polarity, forming phase-corrected data $e^{j\Theta(X,Y)}$. The polarity-inverted data $e^{j\Theta(X,Y)}$ is Fourier-transformed in the readout direction, thereby obtaining phase-corrected data H (kx, y).

In the meantime, the asymmetrical echo data acquired is subjected, in its entirety, to inverse Fourier transformation in the encode direction, thus obtaining data R'(kx, y). The R'(kx, y) and the phase-correction data H (kx, y) are convoluted, generating data R(kx, y) which is free of phase distortion. The data representing an unmeasured region is formed by utilizing the relationship of R(−kx, y)=R(kx, y)*. Thereafter, the unmeasured data thus formed and the data already obtained are synthesized, forming synthesized data. Inverse Fourier transformation is performed on the synthesized data, in the readout direction kx, thereby obtaining an image not affected by phase distortion and having no artifacts.

The fifth embodiment of the present invention will be described, with reference to the flow chart of FIG. 24. The fifth embodiment is characterized in the step 314' which corresponds to step 314 performed in the fourth embodiment. In step 314', "0" data is inserted into the asymmetrical echo data as can be understood from the fourth item shown in FIG. 24. Thereafter, the echo signal data and phase data are convoluted.

Namely, in the fifth embodiment, "0" data is inserted into the asymmetrical echo signal prior to the convolution.

This method solves the problem that artifacts result from the phase distortion in a spatial-frequency component, which is great if a region such as the nasal cavity where the magnetic field abruptly changes is to be visualized. In other words, unless the phase distortion is completely eliminated, there will occur phase discontinuity between the produced data and the unmeasured, inevitably resulting in prominent artifacts. In the conventional method, phase discontinuity takes places in the plane, kx=0, where each signal has the greatest magnitude, and large artifacts occur unavoidably.

Figure 24:
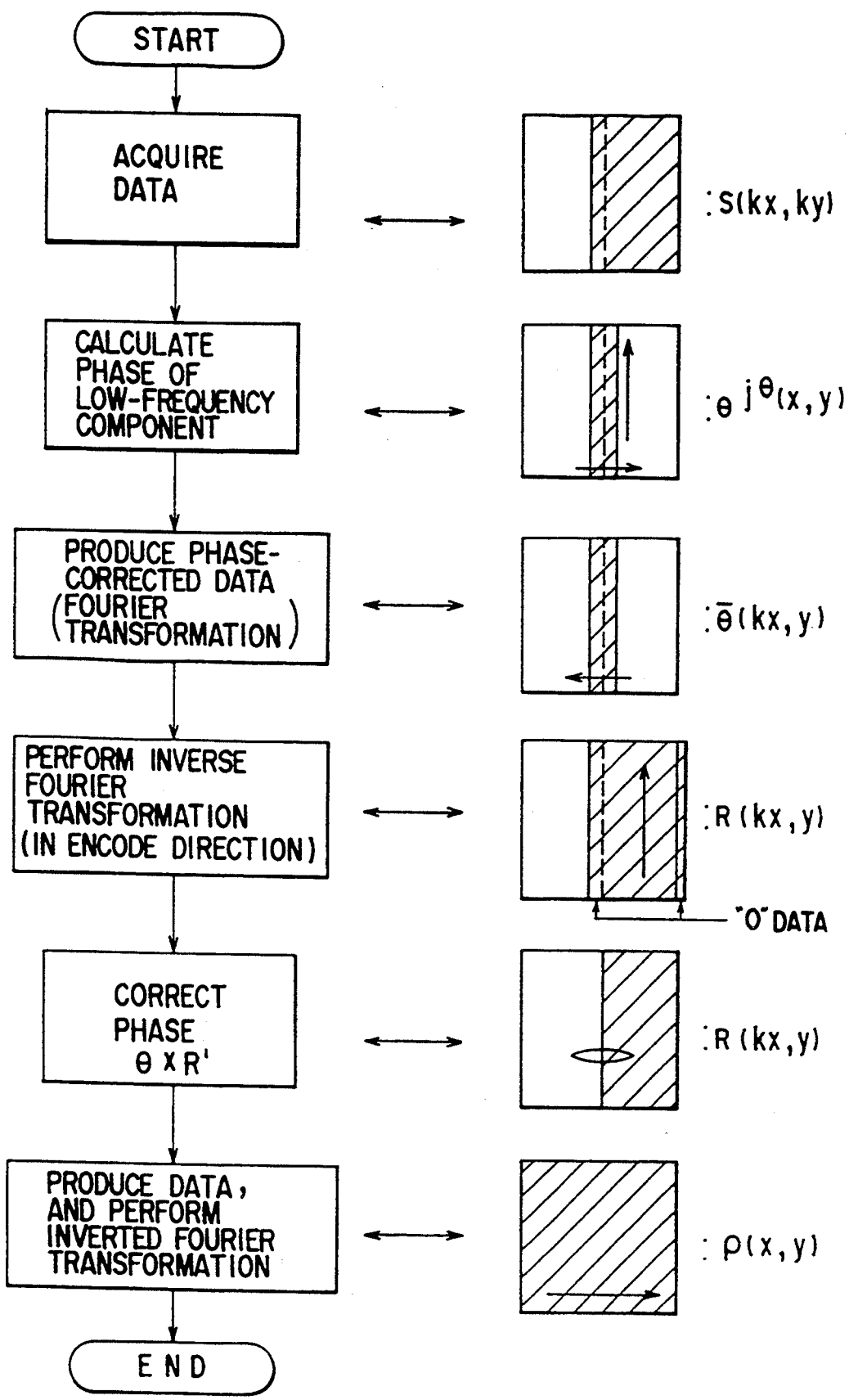
FIG. 24 is a flow chart of an asymmetric echo reconstruction method performed in a fifth embodiment of the present invention.

In the fifth embodiment, to solve this problem, "0" data is added to the center part of the asymmetrical echo as is indicated by the fourth item shown in FIG. 24, thereby producing more data than the data free of phase distortion. Supplemental data, or unmeasured data is produced by utilizing the complex conjugate property of the echo data actually acquired. As a result, phase discontinuity occurs at a point where the asymmetrical echo signal has a small magnitude, and the artifacts becomes less prominent.

Figure 23:
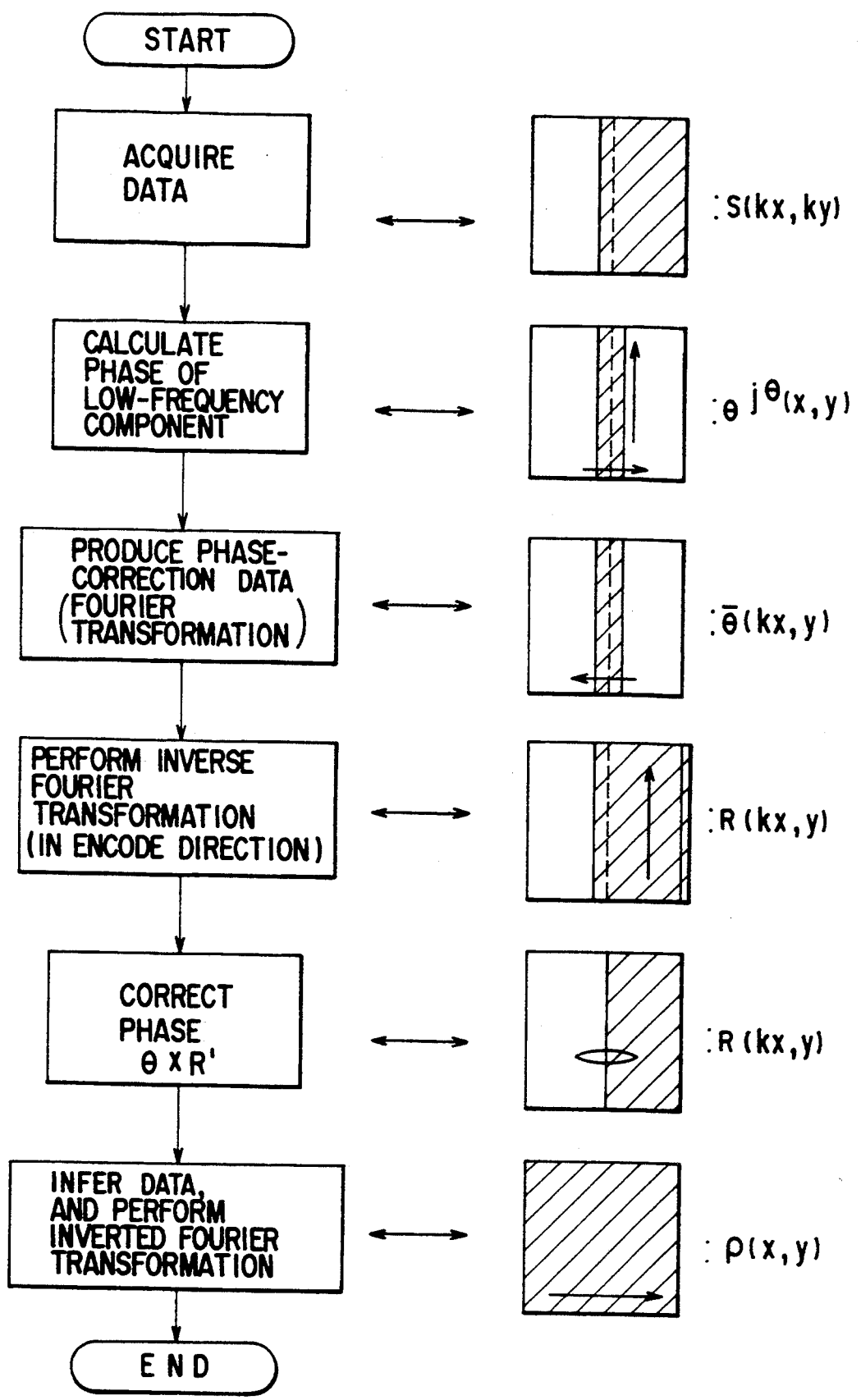
FIG. 23 is a flow chart of an asymmetric echo reconstruction method.

The fifth embodiment will now be described in greater detail, with reference to the flow chart of FIG. 23. Signal S"(kx, ky) for the k space is comprised of data acquired in the positive direction of kx and a small amount of data acquired in the negative direction of kx. The pulse sequence used in the fifth embodiment is designed to acquire data from 128 points in the positive direction and from 8 points in the negative direction. Hence, (128+8)×256 points bits are obtained in all.

Of the points thus obtained, the 16×256 bits acquired from the center of the k space are subjected to inverse Fourier transformation, producing phase data exp(j−Θ(x, y). The phase data is inverted in polarity and Fourier-transformed in the readout direction, thereby generating phase-corrected data H (kx, y). Meanwhile, inverse Fourier transformation is performed on the asymmetrical echo data S(kx, ky), in the encode direction, obtaining data R"(kx, y). Three data items, each consisting of eight 0s, are added to the center and extremities of this data R"(kx, y), respectively, producing data R'(kx, y) consisting of (8+128+8+8)×256 bit.

The phase-correction data H (kx, y) and the data R'(kx, y), obtained as described above, are convoluted, generating data R(ky, y). This data R(ky, y) consists of (128+8)×256 points because the two data items, each consisting of eight 0s, added to the extremities of this data R"(kx, y) cannot be reproduced. Owing to these two data items added to the extremities of the data R'(kx, y), 8-points data items can be generated in the negative direction of kx, as well, whereas such data items can be generated in the positive direction only in the conventional asymmetrical echo reconstruction method.

Unmeasured data consisting of (128+8)×256 points is generated, by utilizing the complex conjugate property of the echo data actually acquired, which is given by:

$$R(kx, y) = R(-kx, y)$$

The unmeasured data is subjected to inverse Fourier transformation, in the readout direction. As a result, phase discontinuity occurs on the line of kx=−8, even if the phase distortion has resulted from the high spatial-frequency component and cannot therefore be eliminated completely. In most images, the phase distortion is much less on the line of kx=−8, than on the line of kx=0, and the artifacts resulting from phase discontinuity, if any, are small.

As has been described, the present invention can provide a magnetic resonance imaging apparatus which has a short image reconstruction time and which can improve the S/N ratio, without darkening images of regions where magnetic field homogeneity is low.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetic resonance imaging apparatus comprising:
   data acquiring means for acquiring asymmetrical echo data consistent of half-echo data relating to a k space and center echo data relating to the center of the k space, from a subject to which a static magnetic field, gradient magnetic fields, and radio-frequency electro-magnetic waves have been applied; and
   data producing/reconstructing means for performing inverse Fourier transformation on the center echo data, thereby producing phase data, for inverted the phase data in polarity, thereby producing polarity-inverted phase data, for performing Fourier transformation on the polarity-inverted phase data in readout direction, thereby producing phase-correction data, for performing inverse Fourier transformation on the asymmetrical echo data in encode direction, thereby producing echo data, for convoluting the phase-correction data and the echo data in the readout direction, thereby producing convoluted data free of phase distortion, for inferring unmeasured echo data from the convoluted data by utilizing complex conjugate property of the echo data, for performing inverse Fourier transformation on the convoluted data and the inferred data in the readout direction, thereby producing an image free of phase distortion, and for reconstructing from the asymmetrical echo data an MR image of a specific region of the subject.

2. The magnetic resonance imaging apparatus according to claim 1, wherein said data producing/reconstructing means inserts "0" into a part of the asymmetrical echo data, before convoluting the phase-corrected data and the echo data.

3. The magnetic resonance imaging apparatus according to claim 1, wherein said data producing/reconstructing means performs has data-processing means for performing multi-dimensional convolution on the phase-corrected data and the asymmetrical echo data prior to the inverse Fourier transformation of the asymmetrical echo data, thereby producing multi-dimensional convoluted data, and for performing inverse Fourier transformation on the multi-dimensional convoluted data in all directions.

4. The magnetic resonance imaging apparatus according to claim 1, wherein said data acquiring means comprises:
   first magnetic field generating means for generating a static magnetic field which is to be applied to the subject;
   second magnetic field generating means for generating an X-axis gradient magnetic field, a Y-axis gradient magnetic field, and a Z-axis gradient magnetic field, which are to be applied to the subject;
   pulse generating means for generating radio-frequency electro-magnetic waves which are to be applied to the subject;
   sequence controller for driving said second magnetic field generating means and said pulse generating means such that said second magnetic field generating means and said pulse generating means generate the gradient magnetic fields and the high-frequency pulses in a predetermined pulse sequence; and
   means for collecting the asymmetrical echo data sequentially as said sequence controller performs the predetermined pulse sequence.

5. The magnetic resonance imaging apparatus according to claim 4, wherein said pulse sequence is an asymmetrical pulse sequence.

6. The magnetic resonance imaging apparatus according to claim 5, wherein said asymmetrical pulse sequence is one selected from the group consisting of a modified spin echo pulse sequence and a modified field echo pulse sequence.

7. The magnetic resonance imaging apparatus according to claim 5, wherein said asymmetrical pulse sequence is a pulse sequence for acquiring one image selected from the group consisting of two-dimensional image data, three-dimensional image data, four-dimensional image data, and angiograpm data.

8. The magnetic resonance imaging apparatus according to claim 1, wherein said MR image is one selected from the group consisting of a two-dimensional image, a three-dimensional image, a two-dimensional chemical shift image, a three-dimensional chemical shift image, a four-dimensional image, and an angiography.

9. A magnetic resonance imaging apparatus comprising:
   data acquiring means for acquiring a train of magnetic resonance data items in the direction of a specific axis of the X, Y and Z axes and in the direction of a specific polarity, from a subject to which a static magnetic field, gradient magnetic fields, and high-frequency pulses have been applied; and
   image reconstructing means for performing inverse Fourier transformation on the train of magnetic resonance data items in the directions of axes other than said specific axis, thereby producing first data, for synthesizing second data on the k space by using the first data and complex conjugate data of the first data, and for performing inverse Fourier transformation on the second data in the direction of said specific axis, thereby reconstructing an MR image of a specific region of the subject.

10. The magnetic resonance imaging apparatus according to claim 9, wherein said image reconstructing means comprises correction means for obtaining from the first data the value of the phase shift in the direction of each axis, and for eliminating the phase shift in the direction of each axis.

11. The magnetic resonance imaging apparatus according to claim 9, wherein said data acquiring means comprises:
   first magnetic field generating means for generating a static magnetic field which is to be applied to the subject;
   second magnetic field generating means for generating an X-axis gradient magnetic field, a Y-axis gradient magnetic field, and a Z-axis gradient magnetic field, which are to be applied to the subject;
   pulse generating means for generating radio-frequency electro-magnetic waves which are to be applied to the subject;
   sequence controller for driving said second magnetic field generating means and said pulse generating means such that said second magnetic field generating means and said pulse generating means generate the gradient magnetic fields and the radio-frequency electromagnetic waves in a predetermined pulse sequence; and
   means for collecting magnetic resonance signals sequentially as said sequence controller performs the predetermined pulse sequence.

12. The magnetic resonance imaging apparatus according to claim 9, wherein said pulse sequence is an asymmetrical pulse sequence.

13. The magnetic resonance imaging apparatus according to claim 12, wherein said asymmetrical pulse sequence is one selected from the group consisting of a modified spin echo pulse sequence and a modified field echo pulse sequence.

14. The magnetic resonance imaging apparatus according to claim 12, wherein said asymmetrical pulse sequence is a pulse sequence for acquiring one image selected from the group consisting of two-dimensional image data, three-dimensional image data, and angiograph data.

15. The magnetic resonance imaging apparatus according to claim 9, wherein said MR image is one selected from the group consisting of a two-dimensional image, a three-dimensional image, a two-dimensional chemical shift image, a three-dimensional chemical shift image, a four-dimensional image, and an angiograph.

16. A magnetic resonance imaging apparatus comprising:
   data acquiring means for acquiring first half echo data in a specific pulse sequence, from a subject to which a static magnetic field, gradient magnetic fields, and radio-frequency electro-magnetic waves have been applied, for inverting polarities of the gradient magnetic fields in the specific pulse sequence, thereby acquiring second half echo data;
   data synthesizing means for reversing the second half echo data in a readout direction, and for combining the second half echo data, thus reversed, and the first half echo data, thereby synthesizing full echo data; and image reconstructing means for reconstructing the MR image from the full echo data synthesized by said data synthesizing means.

17. The magnetic resonance imaging apparatus according to claim 16, wherein said data acquiring means comprises:

first magnetic field generating means for generating a static magnetic field which is to be applied to the subject;

second magnetic field generating means for generating an X-axis gradient magnetic field, a Y-axis gradient magnetic field, and a Z-axis gradient magnetic field, which are to be applied to the subject;

pulse generating means for generating radio-frequency electro-magnetic waves which are to be applied to the subject;

sequence controller for driving said second magnetic field generating means and said pulse generating means such that said second magnetic field generating means and said pulse generating means generate the gradient magnetic fields and the high-frequency pulses in a predetermined pulse sequence; and means for collecting magnetic resonance signals sequentially as said sequence controller performs the predetermined pulse sequence.

18. The magnetic resonance imaging apparatus according to claim 16, wherein said asymmetrical pulse sequence is one selected from the group consisting of a modified spin echo pulse sequence and a modified field echo pulse sequence.

19. The magnetic resonance imaging apparatus according to claim 16, wherein said asymmetrical pulse sequence is a pulse sequence for acquiring one image selected from the group consisting of two-dimensional image data, three-dimensional image data, and angiograpm data.

20. The magnetic resonance imaging apparatus according to claim 16, wherein said MR image is one selected from the group consisting of a two-dimensional image, a three-dimensional image, a two-dimensional chemical shift image, a three-dimensional chemical shift image, a four-dimensional chemical shift image, and an angiography.

* * * * *